United States Patent
Torii et al.

(10) Patent No.: US 8,207,612 B2
(45) Date of Patent: Jun. 26, 2012

(54) SEMICONDUCTOR DEVICE AND MANUFACTURING METHOD THEREOF

(75) Inventors: Katsuyuki Torii, Niiza (JP); Arata Shiomi, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 158 days.

(21) Appl. No.: 12/682,383

(22) PCT Filed: Sep. 19, 2008

(86) PCT No.: PCT/JP2008/067009
§ 371 (c)(1),
(2), (4) Date: Jun. 9, 2010

(87) PCT Pub. No.: WO2009/060670
PCT Pub. Date: May 14, 2009

(65) Prior Publication Data
US 2010/0264546 A1     Oct. 21, 2010

(30) Foreign Application Priority Data

Nov. 9, 2007  (JP) ................................ 2007-291892
Dec. 20, 2007 (JP) ................................ 2007-328672

(51) Int. Cl.
*H01L 23/48* (2006.01)
(52) U.S. Cl. ... 257/773; 257/774; 257/784; 257/E23.02; 257/E23.141; 438/617; 438/618
(58) Field of Classification Search .................. 438/121, 438/117, 197, 571, 597, 611–613, 617–621, 438/666; 257/734–786, E21.509, E23.024, 257/773, 776, 784, E23.01–E23.079, E23.141–E23.179
See application file for complete search history.

(56) References Cited

U.S. PATENT DOCUMENTS

| 4,906,588 | A  | * | 3/1990 | Harrington, III ............. 438/282 |
| 5,539,244 | A  | * | 7/1996 | Mori et al. .................... 257/784 |
| 6,518,128 | B2 | * | 2/2003 | Hshieh et al. ................ 438/270 |
| 6,921,699 | B2 | * | 7/2005 | Ma et al. ...................... 438/270 |
| 2005/0233499 | A1 | | 10/2005 | Okuda et al. |

FOREIGN PATENT DOCUMENTS

EP    1 970 963 A1    9/2008
JP    10 22322        1/1998

(Continued)

OTHER PUBLICATIONS

Office Action issued Jul. 27, 2011, in European Patent Application No. 08 847 499.4.

*Primary Examiner* — Jasmine Clark
(74) *Attorney, Agent, or Firm* — Oblon, Spivak, McClelland, Maier & Neustadt, L.L.P.

(57) ABSTRACT

The present invention provides a semiconductor device and manufacturing method of the semiconductor device which can prevent breaks in an interlayer insulation film (12) and electrode (13) that arise with bonding while maintaining bonding strength. A semiconductor element (1) mounted on a semiconductor device including an interlayer insulation film (12) which has an aperture part (123) having an opening shape which is defined by an extension part (121) which covers the gate electrode (116) and extends in the first direction, a connection part (122), the extension part (121) and the connection part (122) which connects at fixed intervals in the first direction a pair of extension parts (121) which are adjacent to the second direction, and which exposes a main surface of a base region (112) and a main surface of an emitter region (113). Also, a second width dimension (122W) in the first direction below the connection part (122) is larger than a first width dimension (122W) in the second direction of the emitter region (113) below the extension part (121) of the interlayer insulation film (12).

14 Claims, 14 Drawing Sheets

FOREIGN PATENT DOCUMENTS

| | | |
|---|---|---|
| JP | 2002 222826 | 8/2002 |
| JP | 2005 303218 | 10/2005 |
| JP | 2006 140263 | 6/2006 |
| JP | 2007 165635 | 6/2007 |

* cited by examiner

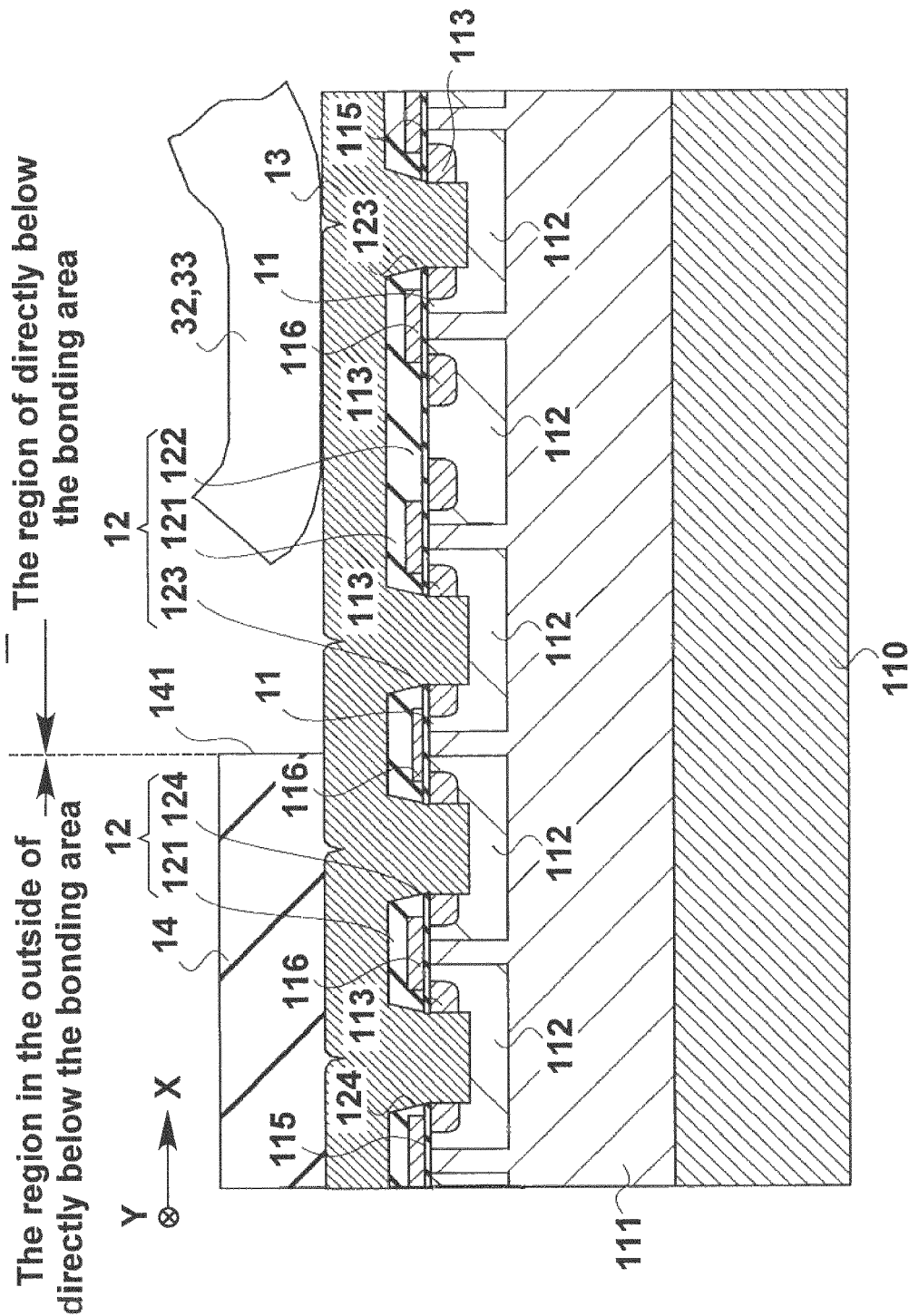

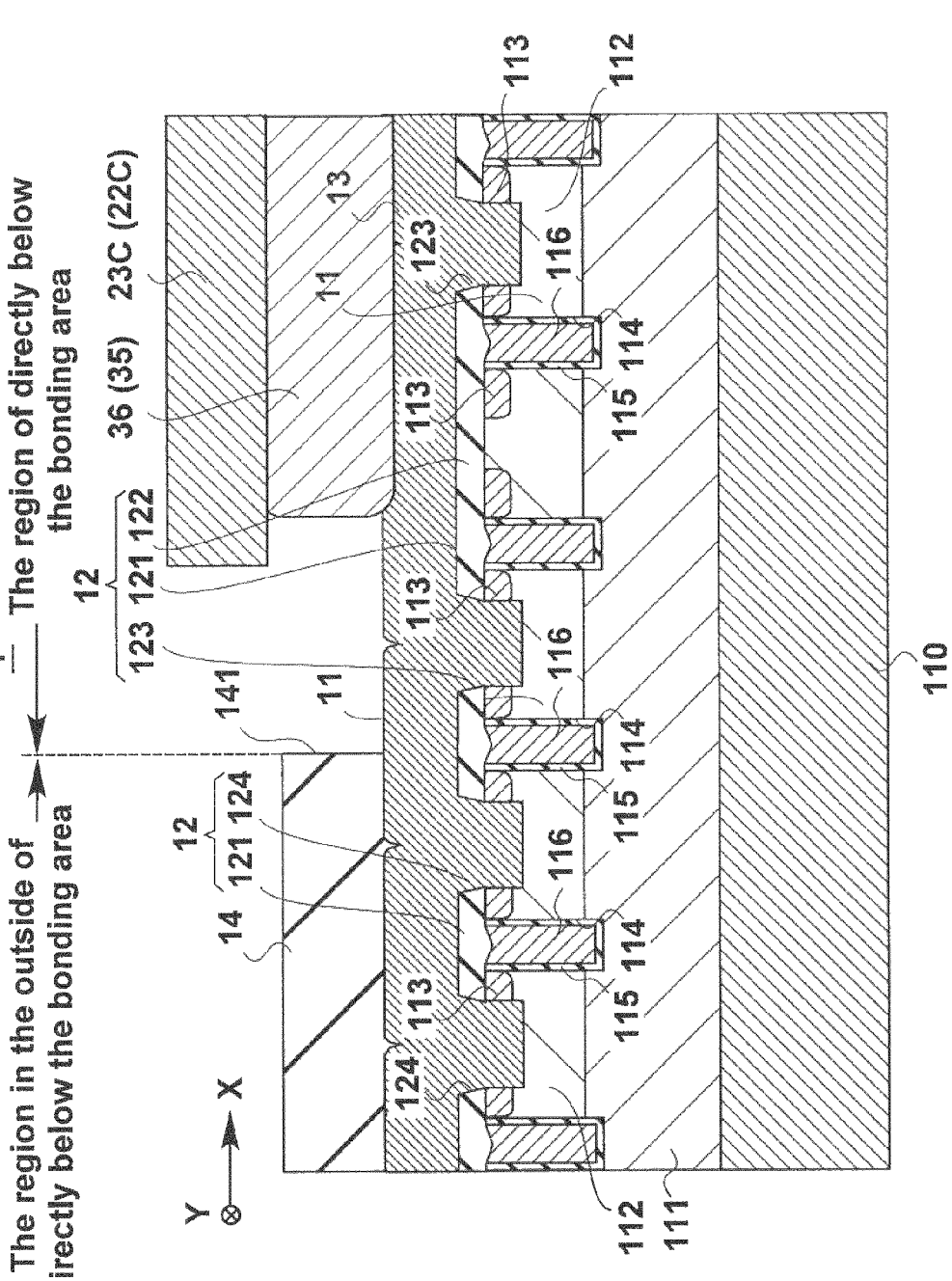

SEMICONDUCTOR DEVICE AND MANUFACTURING METHOD THEREOF

TECHNICAL FIELD

The present invention is related to a semiconductor device and a manufacturing method of the semiconductor device. In particular, the present invention is related to a semiconductor device in which external wiring is connected to an electrode of semiconductor elements and a manufacturing method thereof.

BACKGROUND ART

Semiconductor elements such as an IGBT (insulated gate bipolar transistor) and a power MOSFET (metal oxide semiconductor field effect transistor) are incorporated into a semiconductor device. This type of semiconductor element is a switching device which can control a large current at high speeds.

A semiconductor element, for example, an IGBT, is arranged with a collector region, a base region, an emitter region, a gate insulation film and a gate electrode. The collector region is formed by epitaxial growth on one main surface of a substrate or by diffusion in one main surface part of the substrate. The base region is formed in the other main part of the substrate. The emitter region is formed on the surface part of the base region. The gate insulation film is formed on at least the surface of the base region and the gate electrode is formed on the gate insulation film.

By forming the gate electrode in the shape of a stripe, an IGBT with a stripe structure having a high resistance and small gate capacitance is adopted as a semiconductor element. In the IGBT which adopts this structure, the gate electrode extends on the substrate main surface in a gate length direction, a plurality of the gate electrodes is arranged in series at fixed intervals in the gate width direction, and seen from above, one part of the surface of the emitter region and base region is exposed in a stripe shape in a gate length direction in between the gate electrodes in the gate width direction. An emitter electrode (emitter wiring) is electrically connected to the emitter region and base region in which the surface is exposed. The emitter electrode is formed on an interlayer insulation film between gate electrodes and the interlayer insulation film covers the gate electrode and has a stripe shaped aperture (contact hole) in a gate length direction on the region of the part of the emitter region and base region which is exposed. That is, in a cross section taken in a gate width direction, a plane shape of an interlayer insulation film of a projection which has a gap in adjacent interlayer insulation films by this aperture becomes a stripe shape the same as the plane shape of the gate electrode. Because it is possible to increase the contact area between the emitter electrode and the emitter region, base region and increase current capacitance in an IGBT which has this type of stripe structure, it is possible to reduce the occurrence of electrical filed concentration and realize a large current and high resistance.

An emitter electrode of an IGBT is electrically connected to an emitter lead (external terminal) via bonding wire, and a gate electrode is similarly electrically connected to a gate lead via bonding wire. A collector electrode, for example a collector electrode arranged on the other main surface of a substrate is electrically connected to a collector lead. A wire bonding device is generally used for the bonding wire and bonded by thermal compression combined with ultrasonic vibration. In addition, IGBT is sealed together with the inner parts of each lead and assembled as a semiconductor device.

Furthermore, this type of semiconductor device is described in, for example, patent document 1 and patent document 2 stated below.
[Patent Citation 1]
Japanese Laid Open Patent H10-22322
[Patent Citation 2]
Japanese Laid Open Patent 2002-222826

DISCLOSURE OF THE INVENTION

Technical Problem

However, in the semiconductor stated above, the following points were not considered. When bonding wire which is directly connected to an emitter electrode directly above the IGBT which has a stripe structure is bonded by ultrasonic vibration, tears or breaks occur in an interlayer insulation film or a gate electrode below of the IGBT (cell) below the interlayer insulation film. Specifically, in the IGBT, because a planar shape of the gate electrode and interlayer insulation film has a long thin stripe shape in the gate length direction, the mechanical strength of the gate electrode and the interlayer insulation film is weak and the adhesion area with the ground is small. Moreover, because it has a shape which projects out from the substrate main surface, when the bonding wire is bonded, tears and breaks are produced in the interlayer insulation film and gate electrode. Particularly, when the above stated problem easily occurs when stress is produced in the interlayer insulation film in the gate width direction.

In addition, with the miniaturization of the IGBT, when a trench structure is adopted, the gate electrode planar area (gate width dimension) is reduced on the main surface of the substrate, and the planar area (from a contact hole in a gate width direction to an adjacent next step contact hole) of the interlayer insulation film above the gate electrode is also reduced. That is, because the adhesion area between the substrate main surface and the interlayer insulation film is further reduced, tears or breaks are produced in the interlayer insulation film and gate electrode. Furthermore, in the case where the diameter of the bonding wire is increased in order to manage a large current in a semiconductor device, because the energy of ultrasonic vibration which is required for bonding increases, tears and breaks occur more significantly in the interlayer insulation film and gate electrode.

When such tears and breaks are produced in the interlayer insulation film and gate electrode, insulation defects occur between the emitter electrode (emitter region) and gate electrode. In extreme cases, a short circuit occurs between the emitter electrode and gate electrode.

In order to reduce tears and breaks in the interlayer insulation film and gate electrode, there is a method for weakening the ultrasonic power of the bonding device (during the bonding process) and there is a method for reducing pressure load. However, in the case of adopting this type of method, a sufficient bonding strength (mechanical bonding strength) cannot be obtained between the emitter electrode and the bonding wire. In the case where the binding strength is insufficient, tears occur in the bonding wire from the emitter electrode when resin sealing in the manufacture of the semiconductor device or during operation of the semiconductor device.

In addition, in order to reduce tears and breaks in the interlayer insulation film and gate electrode in the semiconductor element side, there is a method of not arranging an IGBT (cell) in a region in which bonding wire is bonded, and a method for forming an emitter electrode with a thin aluminum film. However, in the former method, because a cell does not exist in a region in a part of the substrate, either an ON voltage which has important electrical characteristics of the IGBT is significantly increased, or the size of the semiconductor elements increases. In addition, in the later method, it is possible to absorb the effects when bonding the bonding wire by the emitter electrode or prevent the effects from propagating under the emitter electrode. However, in the semiconductor manufacturing process, manufacturing costs increase together with an increase in material costs and increase in electrode film formation time. Furthermore, an increase in film thickness of the emitter electrode is linked to an increase in film stress due to the operations of the semiconductor elements and a change in the electrical characteristics of the IGBT is produced because unnecessary stress is added to the IGBT.

The present invention attempts to solve the above stated problems. Therefore, the present invention provides a semiconductor device and manufacturing method of the semiconductor device which can prevent breaks in an interlayer insulation film and electrode that arise with bonding while maintaining bonding strength. Furthermore, the present invention provides a semiconductor device and manufacturing method of the semiconductor device which has semiconductor elements with good electrical characteristics. Furthermore, the present invention provides a semiconductor device and manufacturing method of the semiconductor device which can reduce manufacturing costs.

In addition, the present invention provides a semiconductor device and manufacturing method of the semiconductor device which can prevent breaks in an interlayer insulation film and electrode that arise with bonding while maintaining bonding strength as well as maintain breakage tolerance.

Technical Solution

In order to solve the above stated problems, a first feature related to an embodiment of the present invention is a semiconductor device including a substrate having a first edge and a second edge opposing each other in a first direction and a third edge and a fourth edge opposing each other in a second direction which intersects the first direction, a plurality of first semiconductor regions arranged in the second direction on the substrate and exposing a first main surface and having a first conductivity, a plurality of second semiconductor regions arranged in the second direction within the first semiconductor region and exposing a second main surface on the first main surface of the first semiconductor region and having a second conductivity, a control electrode arranged between the second semiconductor region of the first semiconductor region and other second semiconductor regions of other first semiconductor regions which are adjacent in the second direction, an interlayer insulation film having an aperture part which exposes the first main surface of the first semiconductor region and the second main surface of the second semiconductor region, the aperture part having an aperture shape defined by a connection part which connects at fixed intervals in the first direction extension parts adjacent in the second direction, the extension part extending in the first direction and covering the top of the control electrode, and an electrode arranged on the interlayer insulation film and which electrically connects the first main surface of the first semiconductor region and the second main surface of the second semiconductor region via the aperture part of the interlayer insulation film.

Another feature related to an embodiment of the present invention is a semiconductor device including a hole which extends in the first direction and is arranged between the second semiconductor region of the first semiconductor region and other second semiconductor regions of other first semiconductor regions adjacent in the second direction and which penetrates the first semiconductor region on the substrate side from the first main surface of the first semiconductor region, and an insulation film arranged on a side surface of the hole and the bottom surface of the hole, wherein the control electrode is buried in the hole via the insulation film.

Another feature related to an embodiment of the present invention is a semiconductor device including a third semiconductor region arranged between the second semiconductor region of the first semiconductor region and other second semiconductor regions of other first semiconductor regions adjacent in the second direction, and exposing a third main surface and having a second conductivity, and an insulation film arranged on the third main surface of the third semiconductor region, wherein the control electrode is arranged on the third main surface of the third semiconductor region via the insulation film.

Another feature related to an embodiment of the present invention is the semiconductor device according to the first feature wherein the interlayer insulation film is formed in a mesh shape by the extension part, the connection part and the aperture part.

Another feature related to an embodiment of the present invention is the semiconductor device according to the first feature, wherein the connection part of the interlayer insulation film is arranged in a region directly below a bonding area of the electrode.

Another feature related to an embodiment of the present invention is the semiconductor device according to the first feature, wherein external wiring of a wire or a clip lead is electrically connected to the electrode.

A second feature related to an embodiment of the present invention is a method of manufacturing a semiconductor device including forming a substrate having a first edge and a second edge opposing each other in a first direction and a third edge and a fourth edge opposing each other in a second direction which intersects the first direction, a plurality of first semiconductor regions arranged in the second direction on the substrate and exposing a first main surface and having a first conductivity, a plurality of second semiconductor regions arranged in the second direction within the first semiconductor region and exposing a second main surface on the first main surface of the first semiconductor region and having a second conductivity, a control electrode arranged between the second semiconductor region of the first semiconductor region and other second semiconductor regions of other first semiconductor regions which are adjacent in the second direction, forming an interlayer insulation film having an aperture part which exposes the first main surface of the first semiconductor region and the second main surface of the second semiconductor region, the aperture part having an aperture shape defined by a connection part which connects at fixed intervals in the first direction extension parts adjacent in the second direction, the extension part extending in the first direction and covering the top of the control electrode, forming an electrode arranged on the interlayer insulation film and which electrically connects the first main surface of the first semiconductor region and the second main surface of the second semiconductor region via the aperture of the interlayer insulation film, and forming external wiring which is electrically connected to the electrode on the electrode.

Another feature of an embodiment of the present invention related to the second feature is the method of manufacturing a semiconductor device, wherein forming an interlayer insulation film is forming the interlayer insulation film in which the connection part is arranged in a region directly below a bonding area, and forming the external wiring is forming the external wiring which is electrically connected to the electrode in the bonding area.

A third feature related to an embodiment of the present invention is a semiconductor device including a semiconductor region having a first conductivity, a plurality of second semiconductor regions arranged in a second direction and exposing a first main surface and giving a second conductivity opposite to the first conductivity, a plurality of third semiconductor regions arranged in the second direction within the second semiconductor region, exposing a second surface within the second semiconductor region and having the first conductivity, a control electrode arranged between the third semiconductor region of the second semiconductor region and other third semiconductor regions of other second semiconductor regions which are adjacent in the second direction, an interlayer insulation film having an aperture part which exposes the first main surface of the first semiconductor region and the second main surface of the third semiconductor region, the aperture part having an aperture shape defined by a connection part which connects at fixed intervals in the first direction extension parts adjacent in the second direction, the extension part extending in the first direction which intersects the second direction and covering the top of the control electrode, and an electrode arranged on the interlayer insulation film and which electrically connects the first main surface of the second semiconductor region and the second main surface of the third semiconductor region via the aperture part of the interlayer insulation film, wherein a second width dimension in the first direction of the third semiconductor region below the connection part is larger than a first width dimension in the second direction of the third semiconductor region below the extension part.

Another feature related to the third feature of an embodiment of the present invention is the semiconductor device wherein the aperture part penetrates the third semiconductor region.

Another feature related to the third feature of an embodiment of the present invention is the semiconductor device wherein the first width dimension and the second width dimension satisfies the following relationship formula;

Second width dimension<2.0×first width dimension−2.6×first width dimension

Another feature related to the third feature of an embodiment of the present invention is the semiconductor device, further including a hole which extends in the first direction and is arranged between the third semiconductor region of the second semiconductor region and other third semiconductor regions of other second semiconductor regions adjacent in the second direction and which penetrates the second semiconductor region on the first semiconductor region side from the first main surface of the second semiconductor region, and an insulation film arranged on a side surface of the hole and the bottom surface of the hole, wherein the control electrode is buried in the hole via the insulation film.

Another feature related to the third feature of an embodiment of the present invention is the semiconductor device, wherein the connection part of the interlayer insulation film is arranged in a region directly below a bonding area of the electrode.

A fourth feature related to an embodiment of the present invention is a method of manufacturing a semiconductor device including forming a semiconductor region having a first conductivity, a plurality of second semiconductor regions arranged in a second direction and exposing a first main surface and giving a second conductivity opposite to the first conductivity, a plurality of third semiconductor regions arranged in the second direction within the second semiconductor region, exposing a second surface within the second semiconductor region and having the first conductivity, a control electrode arranged between the third semiconductor region of the second semiconductor region and other third semiconductor regions of other second semiconductor regions which are adjacent in the second direction, forming an interlayer insulation film having an aperture part which exposes the first main surface of the first semiconductor region and the second main surface of the third semiconductor region, the aperture part having an aperture shape defined by a connection part which connects at fixed intervals in the first direction extension parts adjacent in the second direction, the extension part extending in the first direction which intersects the second direction and covering the top of the control electrode, forming an electrode arranged on the interlayer insulation film and which electrically connects the first main surface of the second semiconductor region and the second main surface of the third semiconductor region via the aperture part of the interlayer insulation film, and forming external wiring which electrically connects the electrode on the electrode in the bonding area.

Advantageous Effects

According to the present invention, it is possible to provide a semiconductor device and manufacturing method of the semiconductor device which can prevent breaks in an interlayer insulation film and electrode that arise with bonding while maintaining bonding strength. Furthermore, according to the present invention, it is possible to provide a semiconductor device and manufacturing method of the semiconductor device which has semiconductor elements with good electrical characteristics. Furthermore, according to the present invention, it is possible to provide a semiconductor device and manufacturing method of the semiconductor device which can reduce manufacturing costs.

In addition, according to the present invention, it is possible to provide a semiconductor device and manufacturing method of the semiconductor device which can prevent breaks in an interlayer insulation film and electrode that arise with bonding while maintaining bonding strength as well as maintain breakage tolerance.

BRIEF DESCRIPTION OF THE DRAWINGS

FIG. 13 is an expanded cross sectional diagram of important parts when arranging bonding on semiconductor elements mounted on a semiconductor device related to a fifth embodiment of the present invention.

FIG. 14 is an expanded cross sectional diagram of important parts when arranging a clip lead on semiconductor elements mounted on a semiconductor device related to a sixth embodiment of the present invention.

BEST MODE FOR CARRYING OUT THE INVENTION

Figure 1:
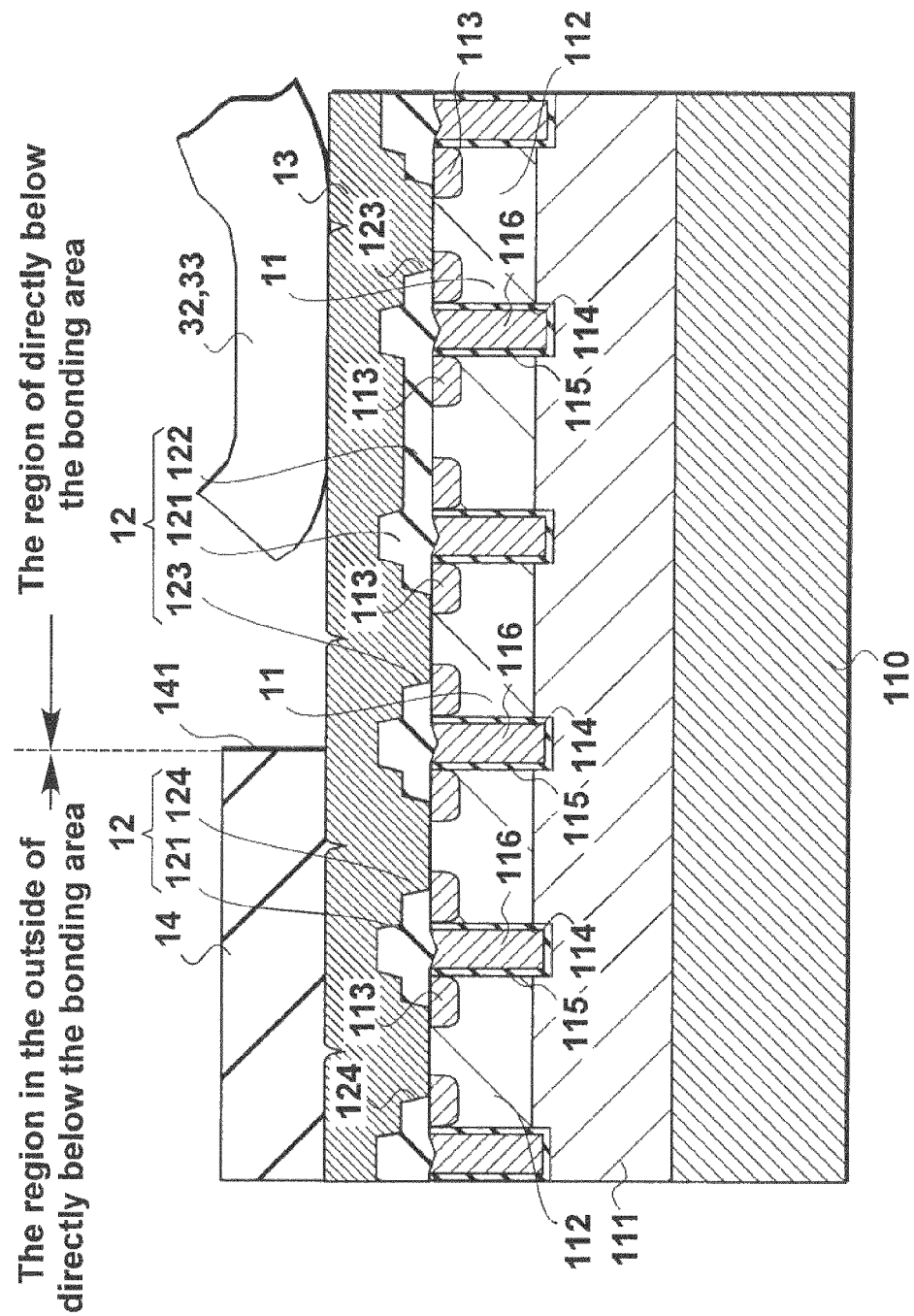
FIG. 1 is an expanded cross sectional diagram of important parts when arranging a bonding wire on semiconductor elements mounted on a semiconductor device related to a first embodiment of the present invention.

Next, the embodiments of the present invention will be explained while referring to the diagrams. The invention will be described with reference to the attached drawings. Like or corresponding parts are denoted by like or corresponding reference numerals. The drawings are schematic, and may sometimes differ from actual components. In addition, dimensions and ratios of components may be different between drawings.

In addition, while the invention herein is disclosed by means of specific embodiments and applications thereof, numerous modifications and variations could be made thereto without departing from the scope of the invention set forth in the claims.

Mode 1 of the Invention

The first embodiment of the present invention explains an example which applies the present invention to a power semiconductor device and manufacturing method of the semiconductor device mounted with semiconductor elements comprised of an IGBT having a trench structure.

Structure of a Semiconductor Element (IGBT) Device

Figure 3:
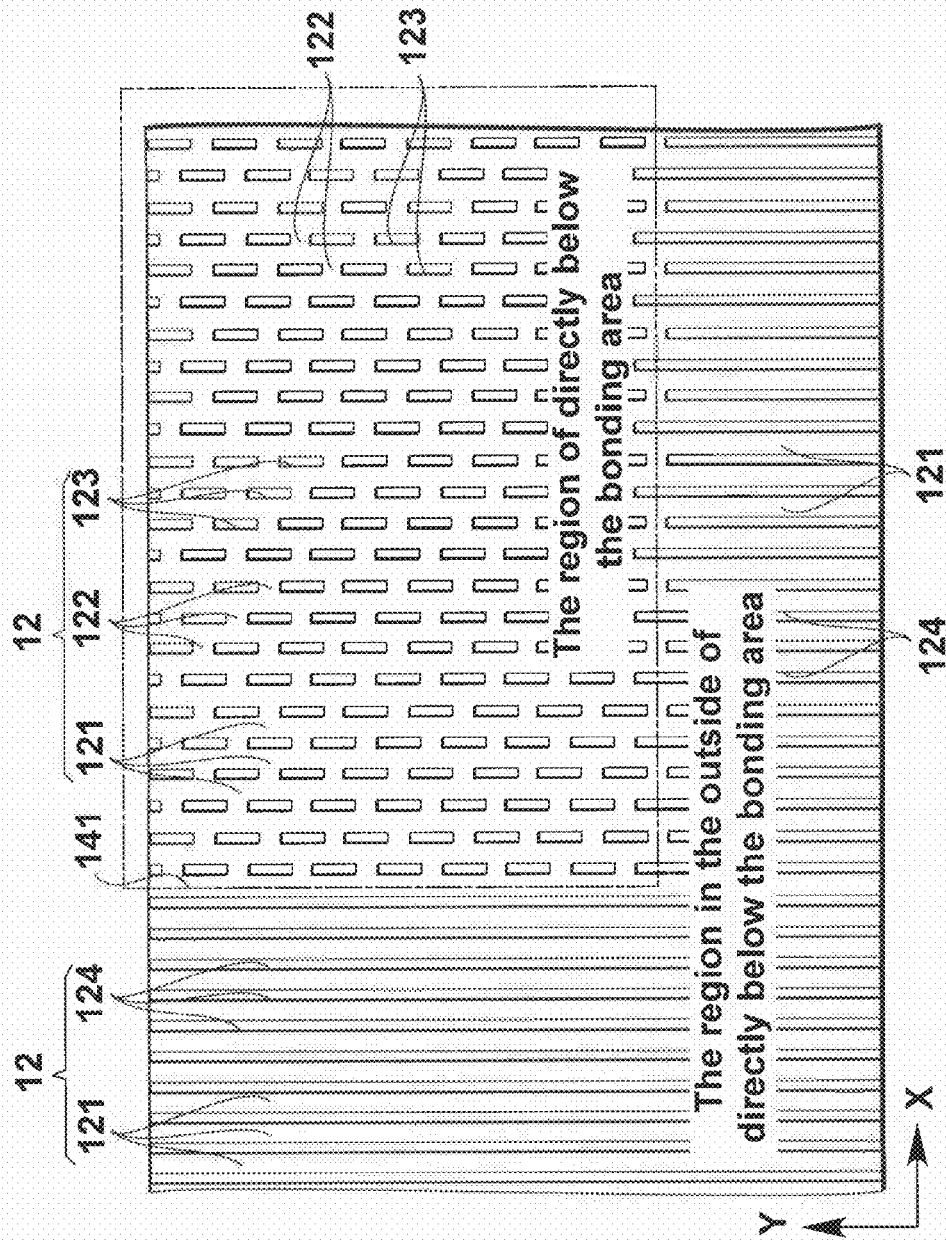
FIG. 3 is an expanded planar diagram of the important parts of the interlayer insulation film in the semiconductor elements shown in FIG. 1.
Figure 4:
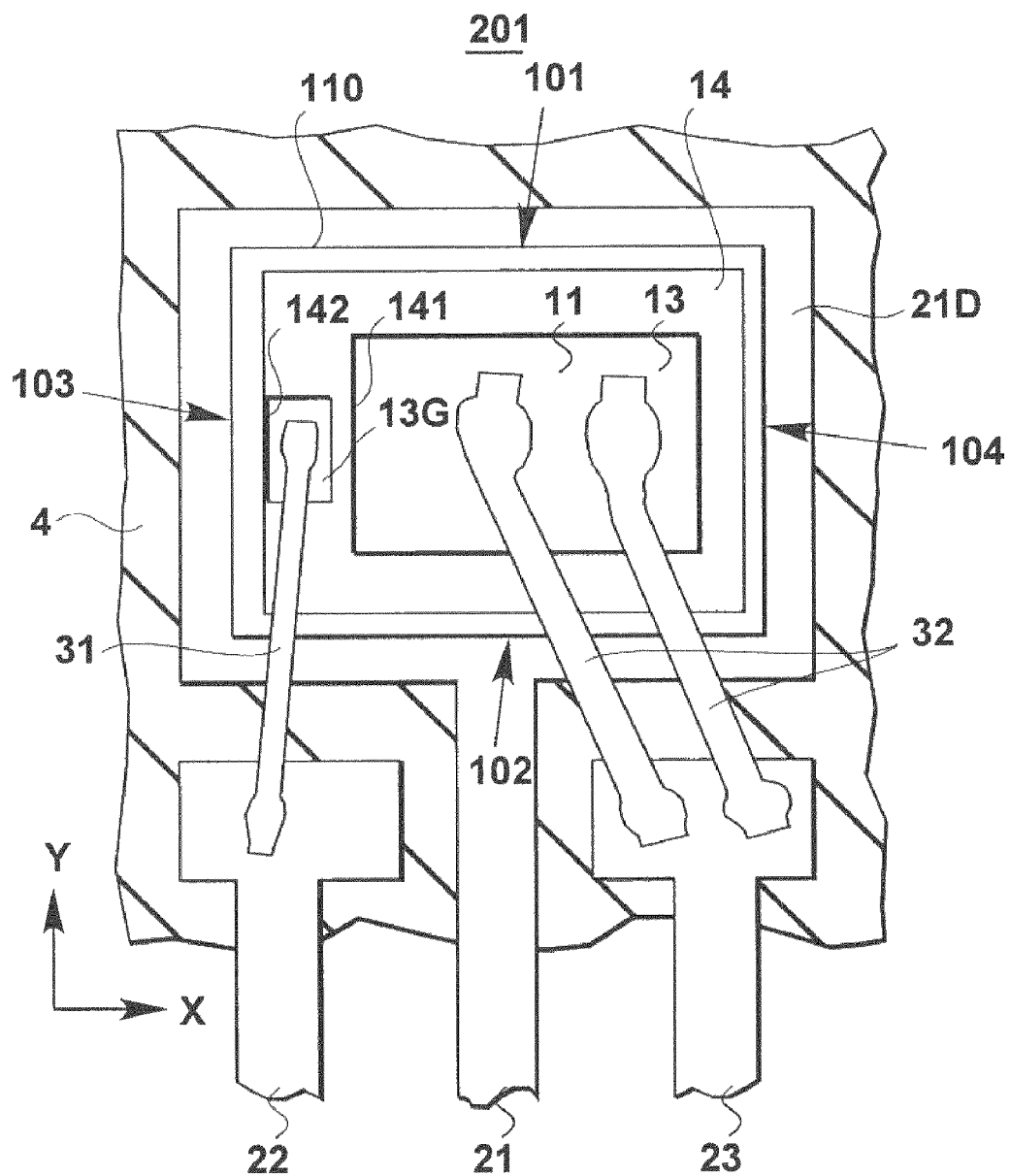
FIG. 4 is a planar diagram which shows the internal structure of the semiconductor device related to the first embodiment.

As is shown in FIG. 1 and FIG. 4, a semiconductor element 1 mounted on a semiconductor device related to the first embodiment is arranged with a substrate 111 (specifically, refer to FIG. 1 and FIG. 4) having a first edge 101 and a second edge 102 which face each other in a first direction and a third edge 103 and a fourth edge 104 which face each other in a second direction which intersects the first direction, a plurality of first semiconductor regions 112 (specifically, refer to FIG. 1 and FIG. 4) arranged in the second direction on the substrate 111 and exposing a first main surface and having a first conductivity, a plurality of second semiconductor regions 113 arranged in the second direction within the first semiconductor region 112 and exposing a second main surface on the first main surface of the first semiconductor region 112 and having a second conductivity opposite to the first conductivity, a gate electrode (control electrode) 116 arranged between the second semiconductor region 113 of the first semiconductor region 112 and other second semiconductor region 113 of other first semiconductor region 112 adjacent to the second direction, an interlayer insulation film 12 (specifically, refer to FIG. 1 and FIG. 3) which has an aperture part 123 having an opening shape which is defined by an extension part 121 which covers the gate electrode 116 and extends in the first direction, a connection part 122, the extension part 121 and the connection part 122 which connects at fixed intervals in the first direction a pair of extension parts 121 which are adjacent to the second direction, and which exposes the first main surface of the first semiconductor region 112 and the second main surface of the second semiconductor region 113, and an electrode 13 arranged on the interlayer insulation film 12 and electrically connected to the first main surface of the first semiconductor region 112 and the second main surface of the second semiconductor surface 113.

Figure 2:
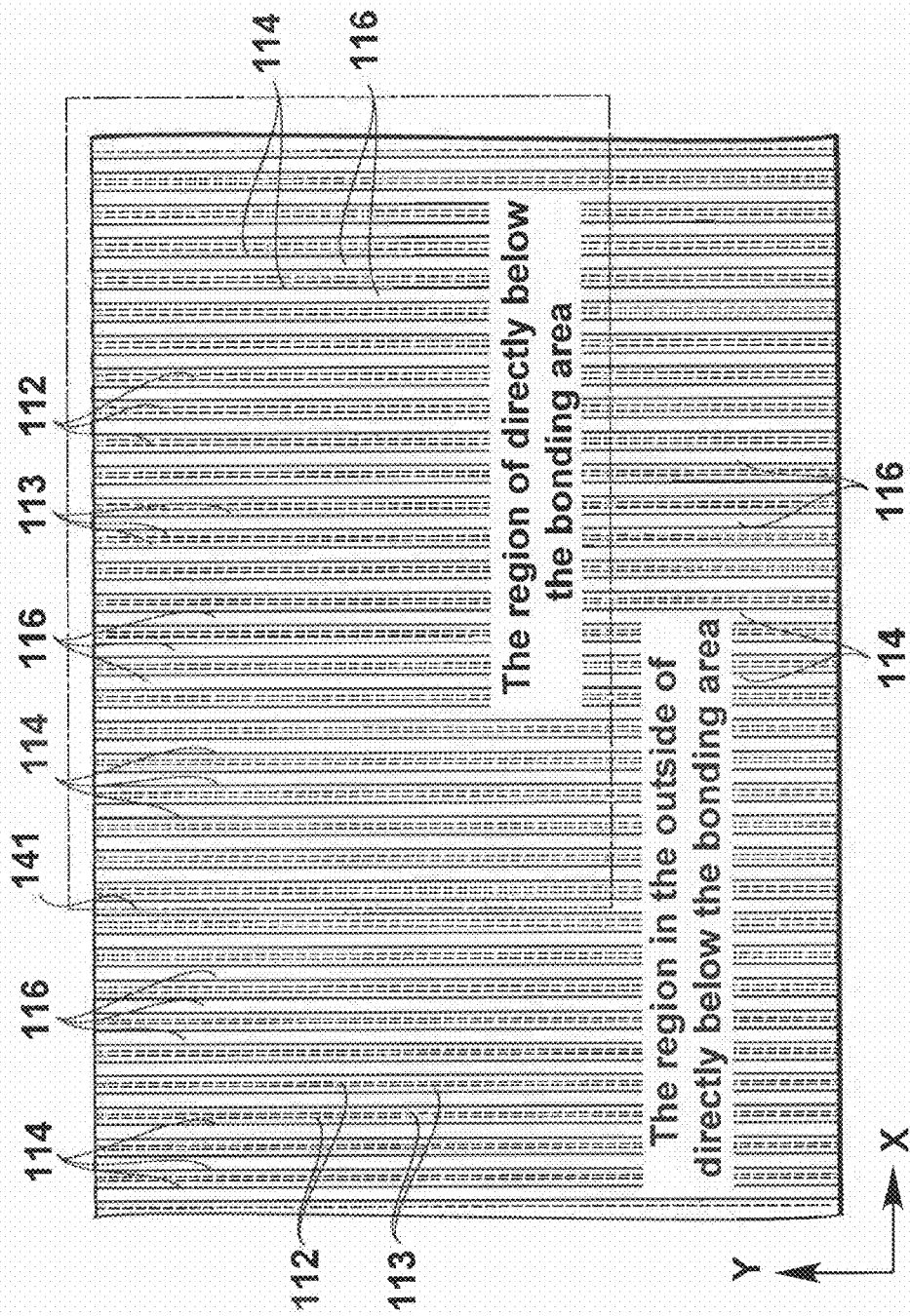
FIG. 2 is an expanded planar diagram of the important parts (one part of the IGBT except a protection film, bonding wire, second electrode and interlayer insulation film) of the semiconductor elements in FIG. 1.

The semiconductor element 1 is an IGBT 11 and in the present embodiment this IGBT 11 is formed by an IGBT having a trench gate structure as shown in FIG. 1 and FIG. 2. That is, the IGBT 11 is arranged with a p type semiconductor region 110 which is a contact region (or drain region (below called a contact region 110)), a substrate 111 (below called base region 111) which is an n type base region and an n type first semiconductor region, a type first semiconductor 112 which his a p type base region (below called base region 112), an n type second semiconductor region 113 which is an emitter region (below called emitter region 113), a hole (trench) 114, a gate insulation film 115, a gate electrode 116, a contact electrode (first electrode), and an emitter electrode (second electrode) 13. Here, gate electrode means an electrode in which the follow of a main current can be controlled, and if the flow of a main current can be controlled then this includes a semiconductor region, a diffusion region and an electrode.

The base region (substrate) 111, as is shown in FIG. 4, is formed with a planar shape having a first edge 101 and a second edge 102 opposing each other in the first direction and a third edge 104 and a fourth edge 104 opposing each other in second direction. The base region 111, in the manufacturing process of the semiconductor element 1, is cut out from a silicon single crystal wafer by a dicing process after manufacturing the IGBT (cell) 11, and is a semiconductor chip. The planar shape of the base region 111 is not always limited to this planar shape. For example, the base region 111 may be formed by a planar rectangle in which the first edge 101 and the second edge 102 are long edges and the third edge 103 and the fourth edge 104 are short edges.

Here, in the first embodiment, first direction is an up down direction in FIG. 2, FIG. 3 and FIG. 4, and is also a Y direction. In addition, second direction is a left to right direction in the same diagrams and is an X direction.

As is shown in FIG. 1, in the present embodiment an n type silicon single crystal substrate is used as the base region 111. A p type semiconductor region 110 is formed by diffusing p type impurities in the one main surface (bottom side surface) of this silicon single crystal substrate by epitaxial growth of a diffusion method. This p type semiconductor region 110 functions as a contact region of the IGBT 11.

The p type base region 112 is formed by diffusing p type impurities in the main surface of the n type base region 111 by an impurity diffusion method. The emitter region (or source region) 113 is formed by diffusing n type impurities in a main surface part of the p type base region 112.

The hole 114 penetrates the p type base region 112 heading in a depth direction (substrate side) from the main surface of the emitter region 113 and has a depth which reaches the n type base region 111 as is shown in FIG. 1. Furthermore, as is shown in FIG. 2, the length direction of the hole 114 extends heading in a first direction from the first edge 101 to the second edge 102, and a plurality of these holes 114 are arranged in rows at fixed intervals in the second direction heading from the third edge 103 to the fourth edge 104. The planar shape of the hole 114 has a stripe shape. The hole 114, for example, is formed using an isotropic etching such as reactive ion etching (RIE).

The gate insulation film 115 is arranged along the inner wall and bottom surface of the hole 114. A silicon oxide film formed using a film formation method such as a thermal oxidation method or CVD method can be used as the gate insulation film 115. In addition, a compound film formed by combining a silicon nitride film, silicon oxide film and a silicon oxide film can also be used as the gate insulation film 115.

The gate electrode 116 is buried within the hole 114 via the gate insulation film 115. In the first embodiment, for example, it is possible to practically use a silicon polycrystalline film in which n type impurities are introduced for securing conductivity as the gate electrode 116. After burying within the hole 114, the gate electrode 116 is formed using an etching method or a chemical mechanical polishing method (CMP). As is shown in FIG. 2, because the planar shape of the hole 114 is formed in a long thin stripe shape in the first direction, the planar shape of the gate electrode 16 is formed in a long thin stripe shape in a first direction according to the planar shape of the hole 114.

As is shown in FIG. 2, the surface region in which a connecting part 112 of the interlayer insulation film 121 is not formed is exposed on the surface of the emitter region 113 which is formed so as to sandwich the gate electrode 116. Similarly, the surface region in which the interlayer insulation film 121 (a connecting part 112) is not formed is exposed on the surface of the p type base region 112. Therefore, each of the emitter region 113 and the p type base region 112 which are between adjacent gate electrodes 116 in the second direction extend in the first direction the same as the extending direction of the gate electrode 116 other than the interior of a bonding area, and a plurality of the emitter regions 113 and the p type base regions 112 are arranged in rows in the second direction. The planar shape of the emitter region 113 and the p type base region 112 are formed in a stripe shape other than in the interior of a bonding area.

As is shown in FIG. 1 to FIG. 4, the planar shape of he interlayer insulation film 12 related to the first embodiment, is a mesh shape which has an extension part 121 is arranged at fixed intervals in the second direction within a bonding area of the second electrode 13 and is arranged between a second electrode 13 and gate electrode 116 extending in the first direction, a connecting part 122 which links with an adjacent extension part 121 and an aperture part 123. In addition, the planar shape of the interlayer insulation film 12 is a stripe shape in which only the extension part 121 is formed between the second electrode 13 and gate electrode 116 outside of the bonding area of the second electrode 13.

The mesh shape of the interlayer insulation film 12 means arranged with the planar shape extension part 121 which has a stripe shape arranged on the gate electrode 116 (hole 114), extends in the same direction as the first direction in which the gate electrode 116 extends and is arranged in rows at fixed intervals in the second direction the same as the gate electrode 116, connecting part 122 formed as one part by linking with an adjacent extension part 121 in the second direction, and the aperture 123 formed in a region which is surrounded by two adjacent extension parts 121 in the second direction and two adjacent connecting parts 122 in the first direction. Because the connection part 122 connects adjacent extension parts 121 in the second direction at fixed intervals in the first direction, it is possible to improve mechanical strength within the bonding area of the second electrode 13 in the interlayer insulation film 12 and the gate electrode 116 directly below. Specifically, it is possible to prevent cracks and tears in the extension part 121 and the gate electrode 116 directly below it with respect to stress which is generated when bonding (for example, ultrasound vibration energy). On the other hand, the connecting part 122 of the interlayer insulation film 12 is arranged between adjacent extension parts 121 in the second direction, however, the connecting part 122 is arranged within the bonding area, and because aperture 123 is arranged as much as possible in the mesh shape also within the bonding area, it is possible to reduce contact area and current capacitance between the emitter 131 and the second electrode 13 and also prevent electrical field concentration. In addition, because it is possible to achieve these effects simply by changing the aperture pattern of the interlayer insulation film 12, because a new process is not added to the manufacturing process, manufacturing becomes easier and manufacturing costs do not increase. In the first embodiment, it is possible to practically use a silicon oxide film, specifically, a phosphosilicate glass (PSG) film as the interlayer insulation film 12, and the thickness of this phosphosilicate glass film is set at 0.5 µm to 3.0 µm for example.

An example of the sizes of each part related to the interlayer insulation film 12 and the structure of the interlayer insulation film 12 is as follows.

1. hole width of the hole 114: 0.5 µm to 3.0 µm
2. arrangement pitch of the hole 114: 2.0 µm to 20.0 µm
3. width of the extension part 121 of the interlayer insulation 12: 1.0 µm to 4.0 µm
4. width of the connecting part 122 of the interlayer insulation 12: 1.0 µm to 19.0 µm
5. arrangement pitch of the connecting part 122 in the first direction: 2.0 µm to 20.0 µm
6. aperture size 123 of the interlayer insulation film 12: 1.0 µm×1.0 µm to 19.0 µm×1.0 µm
7. bonding area size: 50 µm×50 µm to 2 mm×2 mm In the first embodiment, in the planar shape of the interlayer insulation film 12, as is shown in FIG. 3, it is preferable that the connecting part 122 in not arranged in one row in a second direction but has a mesh shape in which the aperture 123 which is arranged in rows at fixed intervals in the first direction and an adjacent aperture 123 in the second direction side are offset. The mount of offset is for example half the arrangement pitch.

Here, the planar shape of the interlayer insulation film 12 which is set in the mesh shape (bonding area of the second electrode 13) is a region in which a bonding wire (32) which electrically connects the second electrode (emitter electrode) 13 with an emitter lead is bonded. A protection film 14 is arranged on the second electrode 13, an aperture 141 is arranged on the protection film and passed through the bonding wire (32), and the bonding area of the second electrode 13 is within the region of the aperture 141 which is arranged in the protective film 14.

The planar shape of the interlayer insulation film 12 outside the bonding area of the second electrode 13 is a stripe shape as stated previously. Specifically, the interlayer insulation film 12 is arranged with a plurality of planar shaped extension parts 121 which has a stripe shape arranged on the gate electrode 116 (hole 114), extends on the same direction as the first direction in which the gate electrode 116 extends, and is arranged at fixed intervals in the second direction the same as the arrangement intervals as the gate electrode 116, and a plurality of apertures 124 having a planar stripe shape formed within a region surrounded by adjacent extension parts 121 in the second direction and arranged at fixed intervals in the second direction. Because it is not necessary to increase mechanical strength against stress which is produced when bonding outside of the bonding area of the second electrode 13, a connecting part 122 is not arranged between adjacent extension parts 121 in the second direction. As a result of not arranging the connecting part 122, it is possible to increase the area of the aperture 124 and therefore it is possible to secure contact area and current capacitance between the emitter region 113 and the second electrode 13 and prevent an electrical field concentration. In addition, it is possible to achieve these effects simply by changing the aperture pattern of the interlayer insulation film 12 and because a process is not added to the manufacturing process, manufacturing becomes easier and manufacturing costs do not increase.

The second electrode (emitter electrode) 13, is arranged on the interlayer insulation film 12 and also electrically connects the emitter region 113 of the IGBT 11 and the p type base region 112. Within the bonding area of the second electrode 13 the second electrode 13 is connected to the IGBT 11 via the aperture 123 of the interlayer insulation film 12 and outside the bonding area of the second electrode 13 is connected to the IGBT via the aperture 124 of the interlayer insulation layer 12. The second electrode 13 is used as an emitter electrode (or source electrode) and it is possible to use an aluminum alloy film for example as the second electrode 13. The aluminum alloy film is an aluminum which is added with additives such as Cu which prevents migration and Si which prevents alloy spikes.

As is shown in FIG. 1, the protection film 14 is arranged on the second electrode 13 in the entire region on the main surface of the substrate 10. As is shown in FIG. 1 to FIG. 4, in the protection film 14, in aperture 141 is arranged in the bonding area on the second electrode 13 in the element region. In addition, in the protection film 14 as is shown in FIG. 4, in the element region, a bonding electrode 13G for electrically connecting to the gate electrode 118 of the IGBT 11 is exposed by the aperture 142 of the protection film 14. The bonding electrode 13G of the gate electrode 116 is formed by the same conduction material in the same conduction layer as the second electrode 13. The aperture 141 of the protection film 14 is arranged at the center part of the base region (substrate) 111 as is shown in FIG. 4, and the aperture 142 is arranged near in the third edge 103 of the base region 111. The planar area of the aperture 142 is small compared to the planar area of the aperture 141. A resin film or PSG film such as PIF (poly-imide film) for example can be used as the protection film 14.

Assembly Structure of the Semiconductor Device

As is shown in FIG. 4, the semiconductor device 201 is arranged with a first lead (collector lead) 21 which extends in a first direction (Y direction) having a die bonding region 21D in which a semiconductor element 1 is mounted, a second lead (gate lead) 22 which extends in the first direction and is adjacent to left side of the first lead 21, a third lead (emitter lead) 23 which extends in the first direction and is adjacent to the right side of the first lead, a bonding wire 31 which electrically connects the second lead and the bonding electrode 13G of the semiconductor element 1, a bonding wire 32 which electrically connects the third lead and a bonding area of the second electrode 13 of the semiconductor element 1, and a sealing body 4.

It is possible to use a Cu plate or a Fe—Ni alloy plate as the first lead 21, second lead 22 and third lead 23. Here, the resistance and inductance component of a metal plate or an alloy plate is small compared to a wire. However, stress generated in a bonding part of the metal plate, allot plate and a bonding area is large. However, in the first embodiment, because a connection part 122 is arranged on the interlayer insulation film 12 in the bonding area of the second electrode 13, the mechanical strength in the bonding area of the second electrode 13 is high. Therefore, in the semiconductor device 201, the resistance and inductance component is reduced, and it is possible to prevent tears in the interlayer insulation film 12 and tears in the gate electrode 116.

Although not shown in detail in FIG. 1 to FIG. 4, the first electrode on the back surface of the semiconductor element 1 is electrically and mechanically connected to the bonding region 21D of the first lead 21 via a conduction adhesive.

The bonding wire 31 penetrates the aperture 142 which is formed on the protection film 14 of the semiconductor element 1 and is electrically connected to the bonding electrode 13G. Similarly, the bonding wire 32 penetrates the aperture 141 which is formed on the protection film 14 above the substrate 10 and is electrically connected to the electrode 13. A wire of Au, Lu, Al for example can be practically used as the bonding wire 31 and 32 and it is possible to bond the wires using thermal compression and ultrasound vibration using a bonding device.

An epoxy resin for example can be used as the sealing body 4. This epoxy resin is formed for example by a molding method. The bonding wires 31 and 32 and an inner part (one part) of each of the semiconductor 1, the first lead 21, the second lead 22 and the third lead 23 are air tight sealed within the sealing body 4. An outer part (one part) of each of the first lead 21, the second lead 22 and the third lead 23 projects out from the exterior of the sealing body 4.

Characteristics of the Semiconductor Device

As is shown in FIG. 1 to FIG. 4, in the semiconductor device 201 related to the first embodiment, the planar structure of the interlayer insulation film 12 within the bonding area is formed in a mesh shape, and because the mechanical strength increases by the connection part 122, the extension part 121 adjacent in a second direction of the interlayer insulation film 12, bonding strength of the interlayer insulation film 12 when bonding is secured, and tears which occur in the interlayer insulation film 12 with bonding and breaks in an electrode (for example, the gate electrode 116 and the second electrode 13) are prevented.

Furthermore, in the semiconductor device 201 related to the first embodiment, because the connection part 122 of the interlayer insulation film 12 is arranged at fixed intervals in the second direction, it is possible to sufficiently secure the planar area of the aperture 123. Therefore, because it is possible to sufficiently secure the contact area which is the original characteristic of the IGBT 11, it is possible to reduce an electric filed concentration, secure sufficient resistance and provide a semiconductor device 201 with the semiconductor element 1 which has good electrical characteristics.

In addition, in the semiconductor device 201 related to the first embodiment, because the planar shape of the interlayer insulation film 12 outside the bonding area is formed in a stripe shape, it is possible to secure the electrical characteristics of the semiconductor element 1 as stated previously.

In addition, in the semiconductor device 1 related to the first embodiment, because it is possible to change the planar shape of the interlayer insulation film 12 for demonstrating these operation effects simply by changing the pattern of a manufacturing mask, there is no particular need to increase the number of manufacturing processes, and it is possible to reduce manufacturing costs. Furthermore, because it is not necessary to increase the thickness of the second electrode 13 and bonding electrode 13G for bonding, it is also possible to reduce manufacturing costs in this way.

Transformation Example

Figure 5:
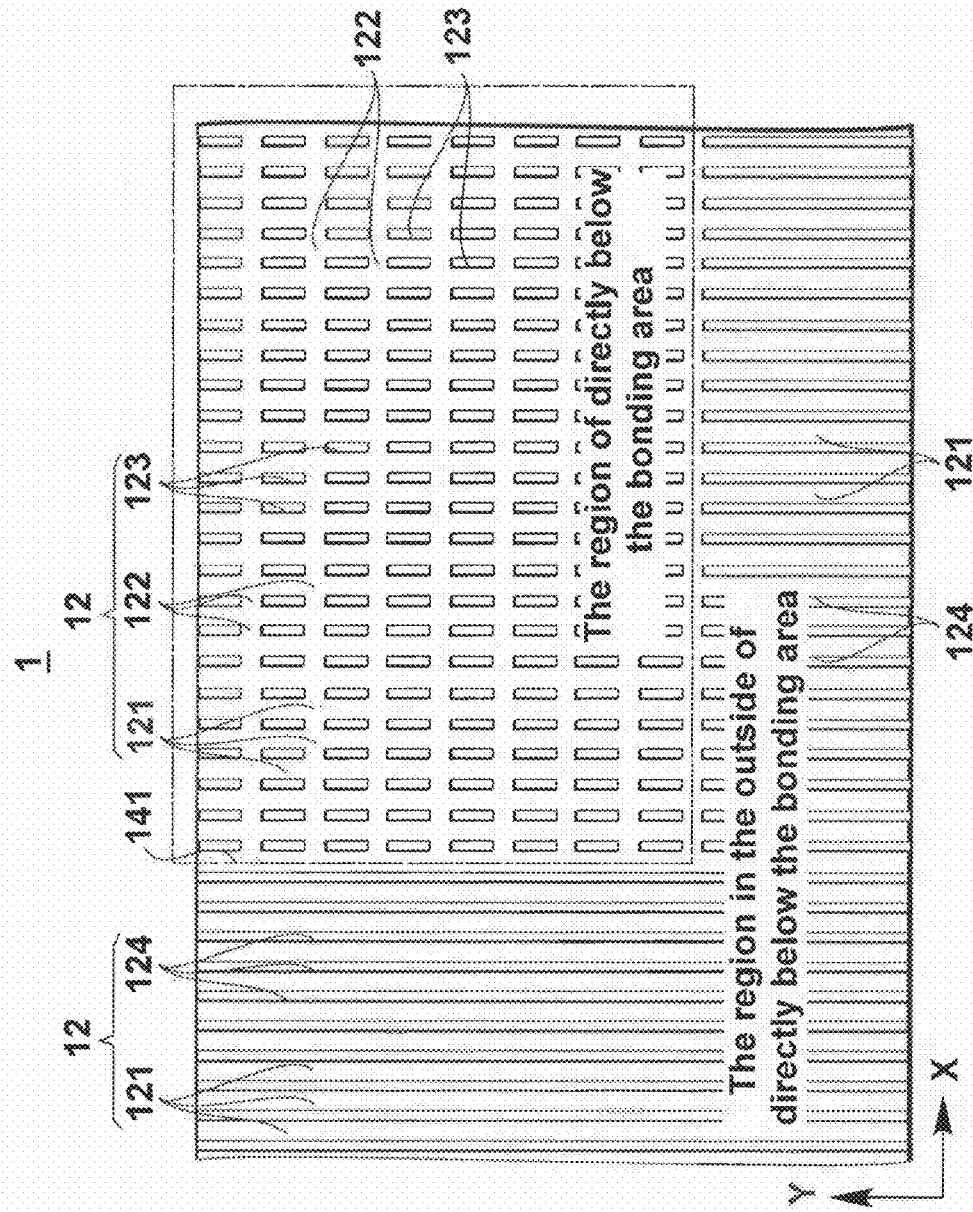
FIG. 5 is an expanded planar diagram of the important parts of the interlayer insulation film in the semiconductor elements related to a transformation example of the first embodiment.

In the semiconductor device 1 related to a transformation example of the first embodiment, the planar shape particularly within the bonding area of the interlayer insulation film 12 of the IGBT 11, as is shown in FIG. 5, is formed by a mesh shape formed as needed so that an aperture 123 arranged at fixed intervals in the first direction and an aperture 123 which is adjacent in the second direction are on the same straight line. That is, the connection part 122 is formed in one straight line when seen in the second direction, and when seen in the first direction is formed repeatedly at fixed intervals, and the planar shape of the interlayer insulation film 12 related to the transformation example un-offset the arrangement pitch of the connection part 122 and aperture 123.

In the semiconductor device 201 related to the transformation example formed in this way, the same effects can be demonstrated as the effects obtained by the semiconductor device 201 related to the first embodiment stated previously.

Furthermore, in the semiconductor device 201 related to the first embodiment, the planar shape of the interlayer insulation film 12 only within a bonding area of the semiconductor element 1 is formed in a mesh shape. However, the present invention is not limited to the type of structure and the planar shape of the interlayer insulation film within and outside the bonding area can be a mesh shape.

Mode 2 of the Invention

The second embodiment of the present invention, explains an example in which the present invention is applied to a power semiconductor device and manufacturing method of the semiconductor device mounted with a semiconductor element comprised of an IGBT having a planar structure.

Device Structure of the Semiconductor Element (IGBT)

Figure 6:
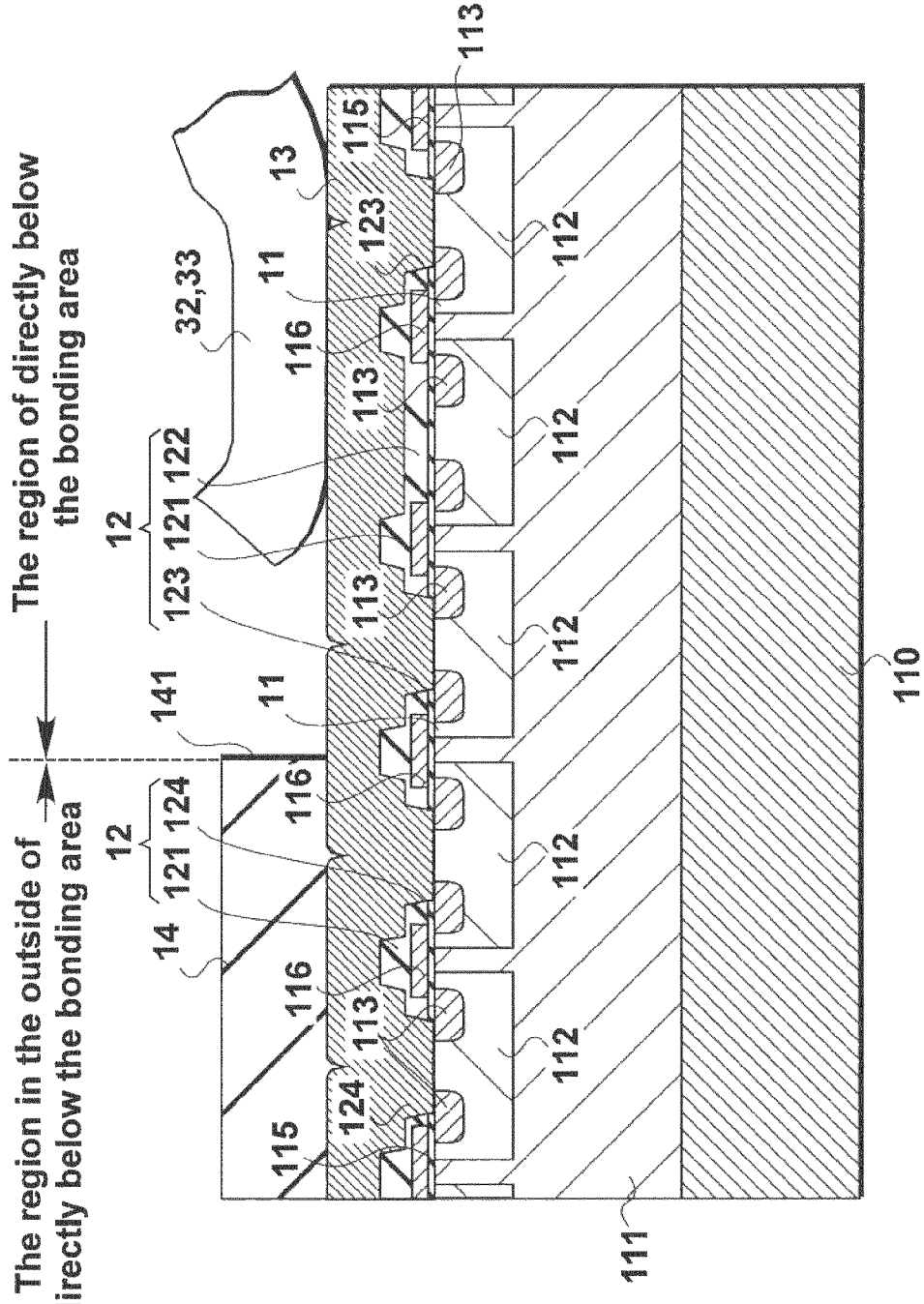
FIG. 6 is an expanded cross sectional diagram of the important when arranging a bonding wire on semiconductor elements mounted on a semiconductor device related to a second embodiment of the present invention.

The semiconductor element 1 mounted on the semiconductor device 201 related to the second embodiment, as shown in FIG. 6, is formed by an IGBT 11 having a planar structure. That is, the IGBT 11 is formed by arranging a collector region (p type second semiconductor region) 110, an n type base region (n type first semiconductor region or substrate) 111, a p type base region (p type first semiconductor region) 112, an emitter region (n type second semiconductor region) 113, a gate insulation film 115, a gate electrode 116, a collector electrode (first electrode) and an emitter electrode (second electrode) 13. A cross sectional structure of a basic semiconductor element 1 is the same as the cross sectional structure of the semiconductor element 1 of the semiconductor device 201 related to the first embodiment stated previously. However, the hole 114 shown in FIG. 1 is not arranged. That is, the semiconductor element 1, the gate electrode 116 is arranged with a planar structure via the gate insulation film 114 on the main surface of the base region 111, and a base region 112 and emitter region 113 are arranged by a double diffusion structure with the gate electrode 116 as a mask.

The interlayer insulation film 12 is formed similar to the semiconductor device 201 related to the first embodiment shown in FIG. 1 to FIG. 4 stated previously, by a planar shaped extension part 121 having a stripe shape extending in the same direction as a first direction in which the gate electrode 118 extends, and arranged on the gate electrode at fixed intervals in a second direction the same as the arrangement intervals of the gate electrode 116, a planar shaped connection part 121 having a stripe shape, a connection part 122 which is connected with the extension part 121 adjacent in the second direction and formed as one unit, and an aperture 123 formed within a region surrounded by two extension parts 121 adjacent in the second direction and two connection parts 122 adjacent in the first direction. That is, the planar shape of the interlayer insulation 12 is formed in a mesh shape within at least the bonding area of the second electrode 13.

Characteristics of the Semiconductor Device

As is shown in the FIG. 6, in the semiconductor device 201 related to the second embodiment, the same as the semiconductor device 201 related to the first embodiment stated above, the planar structure of the interlayer insulation film 12 within the bonding area of the second electrode 13 is formed in a mesh shape, and because the extension part 121 adjacent in the second direction of the interlayer insulation film 12 is connected with the connection part 122 and mechanical strength increases, the bonding strength of the interlayer insulation film 12 is secured when bonding and it is possible to prevent breaks in the interlayer insulation film 12 and breaks in an electrode (for example, gate electrode 116 or second electrode 13) that comes with bonding.

Furthermore, in the semiconductor device 201 related to the second embodiment, because the connection part 122 of the interlayer insulation film 12 is arranged at fixed intervals in the second direction, it is possible to sufficiently secure the planar area (contact area) of the aperture 123. Therefore, because it is possible to sufficiently secure the contact area and current capacitance which is the original characteristic of the semiconductor element 1 having a stripe structure, it is possible to reduce an electric filed concentration, secure sufficient resistance and provide a semiconductor device 201 with the semiconductor element 1 which has good electrical characteristics.

In addition, in the semiconductor device 201 related to the second embodiment, by forming the planar shape of the interlayer insulation film 12 outside the bonding area of the second electrode 13 in a stripe shape shown in FIG. 3, it is possible to secure the electrical characteristics of the semiconductor element 1.

In addition, in the semiconductor device 201 related to the second embodiment, because it is possible to change the planar shape of the interlayer insulation film 12 for demonstrating these operation effects simply by changing the pattern of a manufacturing mask, there is no particular need to increase the number of manufacturing processes, and it is possible to reduce manufacturing costs.

Mode 3 of the Invention

The third embodiment of the present invention explains an example in which the connection method between the semiconductor element 1 with the second lead 22 and the third lead 23 is replaced in the semiconductor device 201 related to the first embodiment and the second embodiment stated previously.

Figure 7:
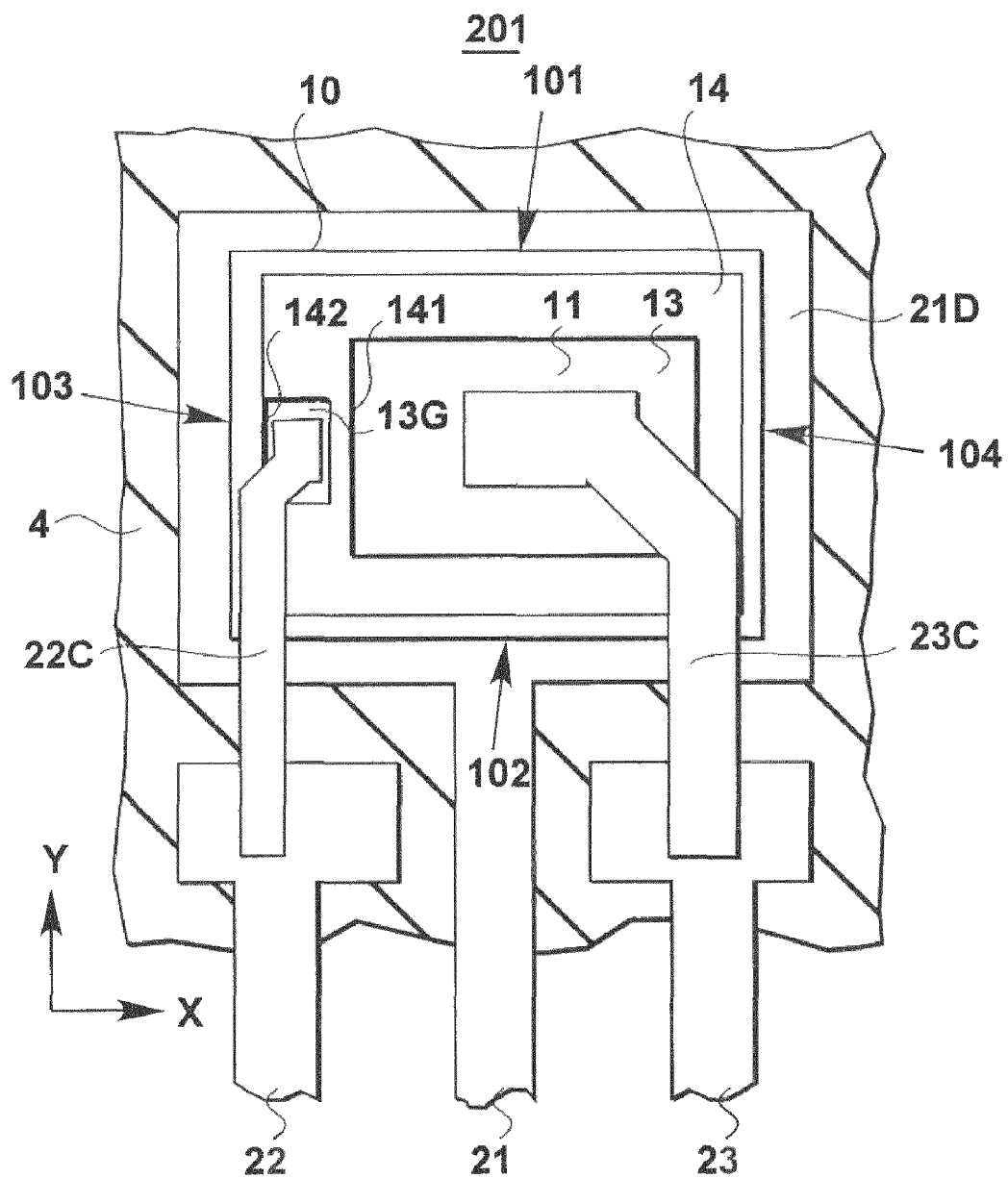
FIG. 7 is a planar diagram which shows the internal structure of a semiconductor device related to a third embodiment of the present invention.
Figure 8:
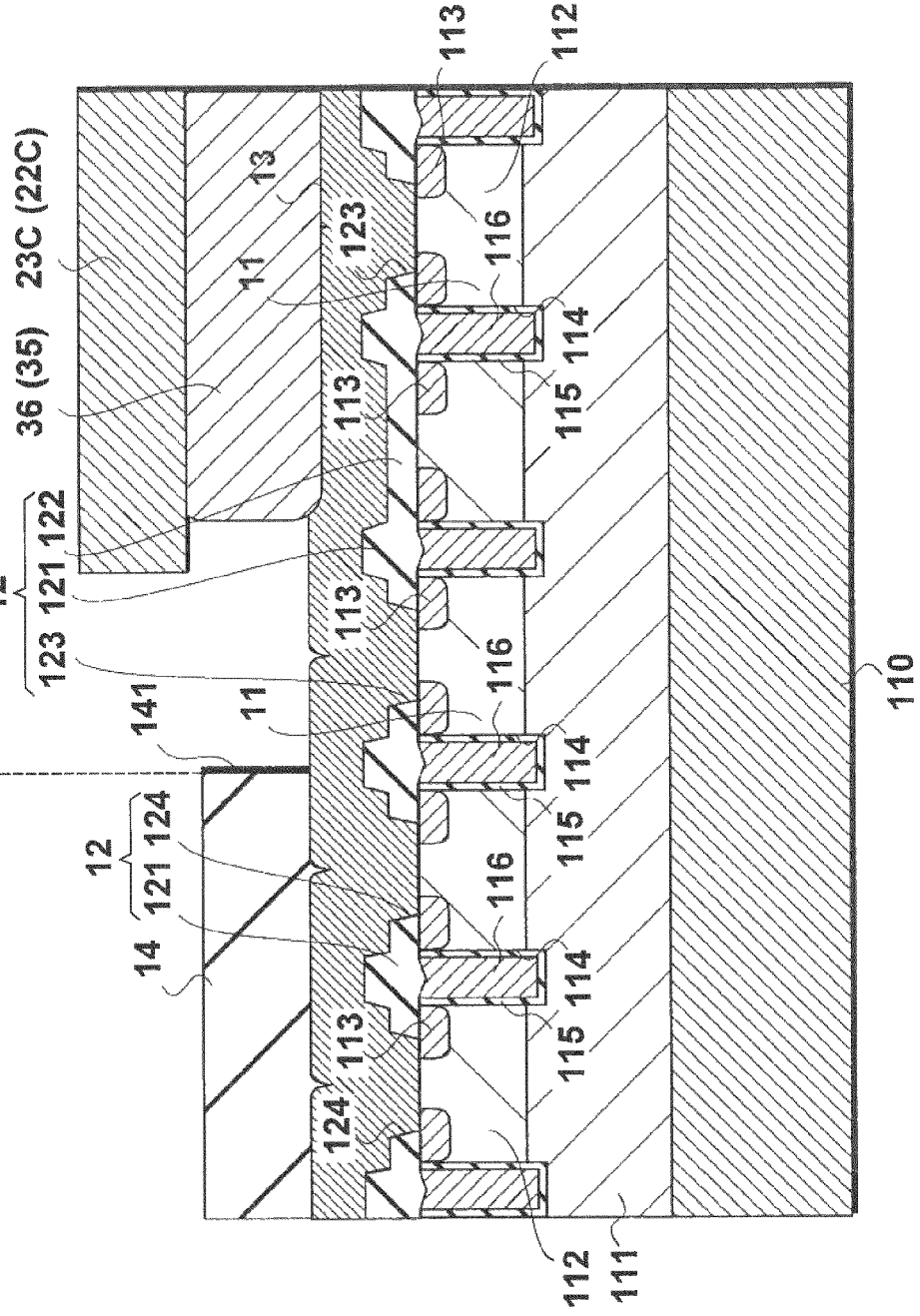
FIG. 8 is an expanded cross sectional diagram of the important parts when arranging a clip lead on semiconductor elements of the semiconductor device shown in FIG. 7.

In the semiconductor device 201 related to the third embodiment, as is shown in FIG. 7 and FIG. 8, the bonding electrode 13G and the second lead 22 of the semiconductor element 1 are electrically connected by a clip lead 22C and the second electrode 13 and the third lead 23 are electrically connected by a clip lead 23C. Soldering paste 35 is used in each of the connections between the clip lead 22C and the bonding electrode 13G and the second clip lead 22, and each are electrically and mechanically connected. Similarly, soldering paste 36 is used in each of the connections between the clip lead 23C and the second electrode 13 and the third clip lead 23, and each are electrically and mechanically connected.

It is possible to use an alloy plate such as a Cu plate or an alloy plate such as a Fe—Ni plate for example for the clip lead 22C and the clip lead 23C. It is possible to use Pb—Sn solder or Pb free solder such as Sn-3 wt % Ag-0.5 wt % Cu for the soldering paste 35 and 36. Similar to the bonding of the bonding wire 31, a bonding method where thermal compression is combined with ultrasound vibrations is used in the connection of the clip lead 22 to the bonding electrode 13G via the soldering paste 35, and the connection of the clip lead 22C to the second lead 22 via the soldering paste 35. Similarly a bonding method which combines thermal compression with ultrasound vibrations similar to a heating method using a heater or bonding of the bonding wire 32, is used in the connection of the clip lead 23C to the second electrode 13 via the soldering paste 36, and the connection of the clip lead 23C to the third lead 23 via the soldering paste 36.

In addition, in order to improve bondability of the bonding electrode 13G and the soldering paste 35, and in order to improve the bondability of the second electrode 13 and the soldering paste 36, a wetability improvement film can be formed on the surface of each of the bonding electrode 13G and the second electrode 13. It is possible to practically use a compound layer stacked with an Ni layer on a Ti layer for example as the wettability improvement film.

In the semiconductor device 201 related to third embodiment formed in this way, the same effects can be demonstrated as the effects obtained by the semiconductor 201 related to the first and second embodiments stated previously.

Furthermore, the resistance and inductance component of a metal plate or alloy plate of the clip lead 22C and 23C is small compared to a wire. Reversely, stress generated at the bonding part between a metal plate or alloy plate and a bonding area is large. However, because a connection part 122 is arranged on the interlayer insulation layer 12 in the bonding area of the second electrode 13 in the third embodiment, it is possible to increase mechanical strength in the bonding area of the second electrode 13. Therefore, in the semiconductor device 201 the resistance and inductance component can be reduced and it is possible to prevent tears in the interlayer insulation film and tears in the gate electrode 116.

Mode 4 of the Invention

The fourth embodiment of the present invention explains an example in which the present invention is applied to a power semiconductor device and manufacturing method of the semiconductor device mounted with a semiconductor element comprised of an IGBT having a trench structure.

Device Structure of the Semiconductor Element (IGBT)

As is shown in FIG. 9 to FIG. 11 and FIG. 2 to FIG. 4 of the first embodiment, the semiconductor element 1 (semiconductor chip) mounted in the semiconductor device related to the fourth embodiment includes a first edge 101 and a second edge 102 which face each other and extend in a second direction (X direction) and a third edge 103 and a fourth edge 104 which face each other and extend in a first direction (Y direction) which intersects the second direction, a first semiconductor region (substrate) 111 (specifically, refer to FIG. 11 and FIG. 4) exposing a first main surface and having a first conductivity, a plurality of second semiconductor regions 112 arranged in the second direction on the first semiconductor region 111 and exposing a second main surface and having a second conductivity opposite to the first conductivity, a plurality of third semiconductor regions 113 (emitter region) arranged in the second direction within the second semiconductor region 112 and exposing a third main surface side of the second semiconductor region 112 and having a first conductivity, a gate electrode (control electrode) 116 arranged between the third semiconductor region 113 within the second semiconductor region 112 and another third semiconductor region 113 within another second semiconductor region 112 adjacent to the second direction, an interlayer insulation film 12 which has an aperture part 123 having an opening shape which is defined by an extension part 121 which covers the gate electrode 116 and extends in the first direction, a connection part 122, the extension part 121 and the connection part 122 which connects at fixed intervals in the first direction a pair of extension parts 121 which are adjacent to the second direction, and which exposes the first main surface of the second semiconductor region 112 and the second main surface of the third semiconductor region 113, and an electrode 13 (emitter electrode) arranged on the interlayer insulation film 12 and electrically connected to the first main surface of the second semiconductor region 112 and the second main surface of the third semiconductor surface 113.

Figure 9:
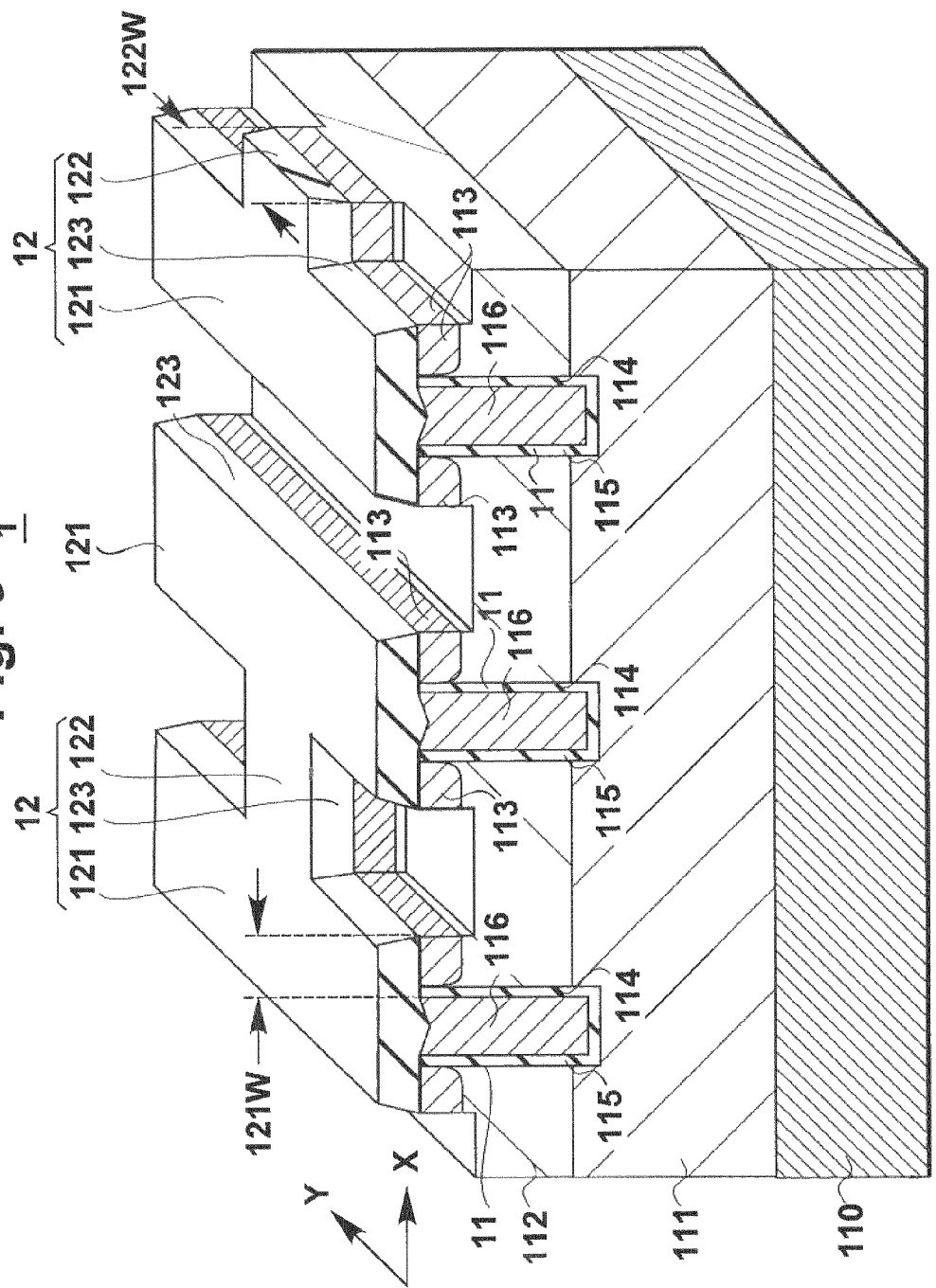
FIG. 9 is an expanded oblique view diagram of the important parts of the semiconductor elements mounted on a semiconductor device related to a fourth embodiment of the present invention.
Figure 10:
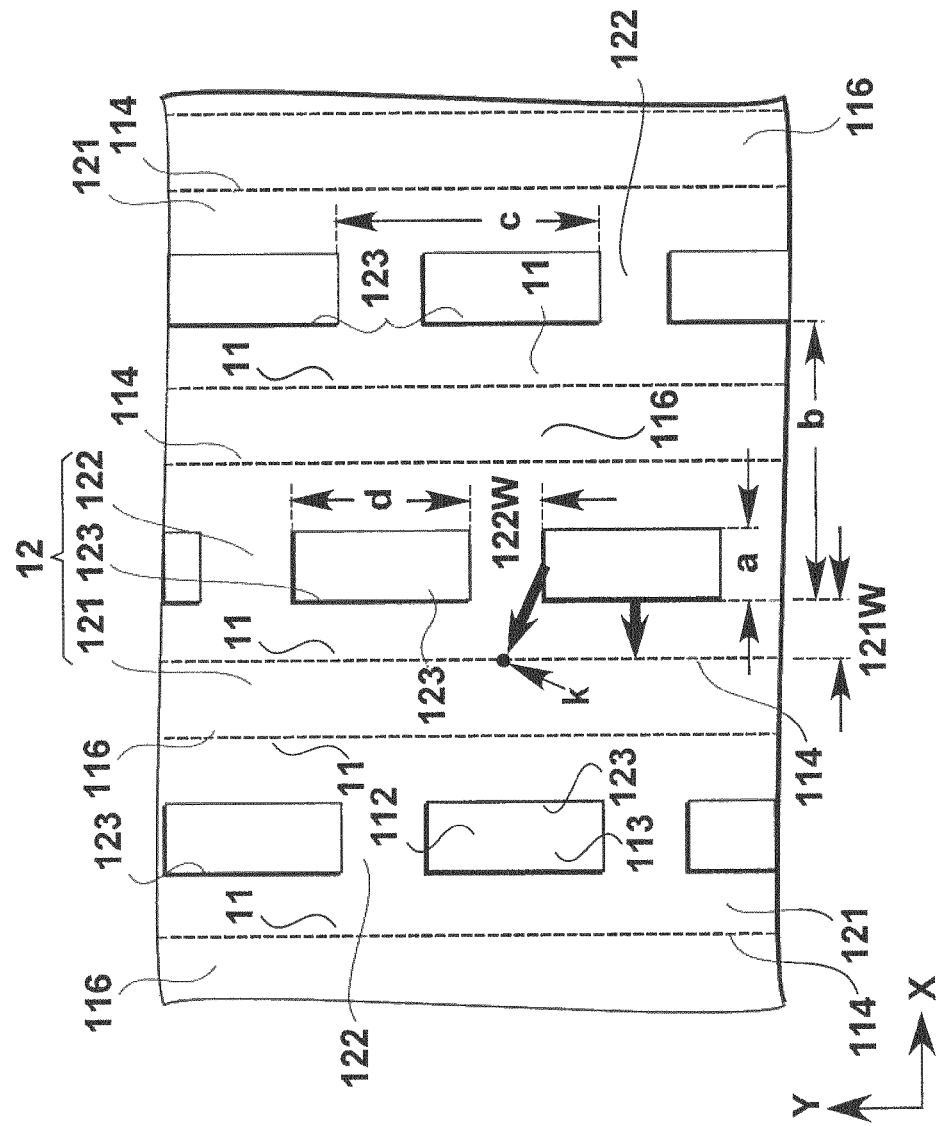
FIG. 10 is an expanded planar diagram of the important parts of the semiconductor elements

Also, the aperture part 123 continues in order to pass through the third semiconductor region 113 with the interlayer insulation film 12 as a mask. As is shown in FIG. 9 and FIG. 10, a first width dimension 121W below the extension part 121 or in a second direction of the third semiconductor region 113 which contacts with the extension part 121 compared with a second width dimension 122W of the first direction of the third semiconductor region 113 which contacts with a connection part 122 below the connection part 122 is set large. As is shown in FIG. 9, because etching is performed until the third semiconductor region 113 is passed through, the first width dimension 121W of the third semiconductor region 113 is dimension from the end of the aperture part 123 side of the extension part 121 on the interlayer insulation film 12 to the gate electrode film 115. In addition, the second width dimension 122W of the third semiconductor region 113 is equivalent to the width dimension of the main surface side which contact with the third semiconductor region 113 of the connection part 112.

Figure 11:
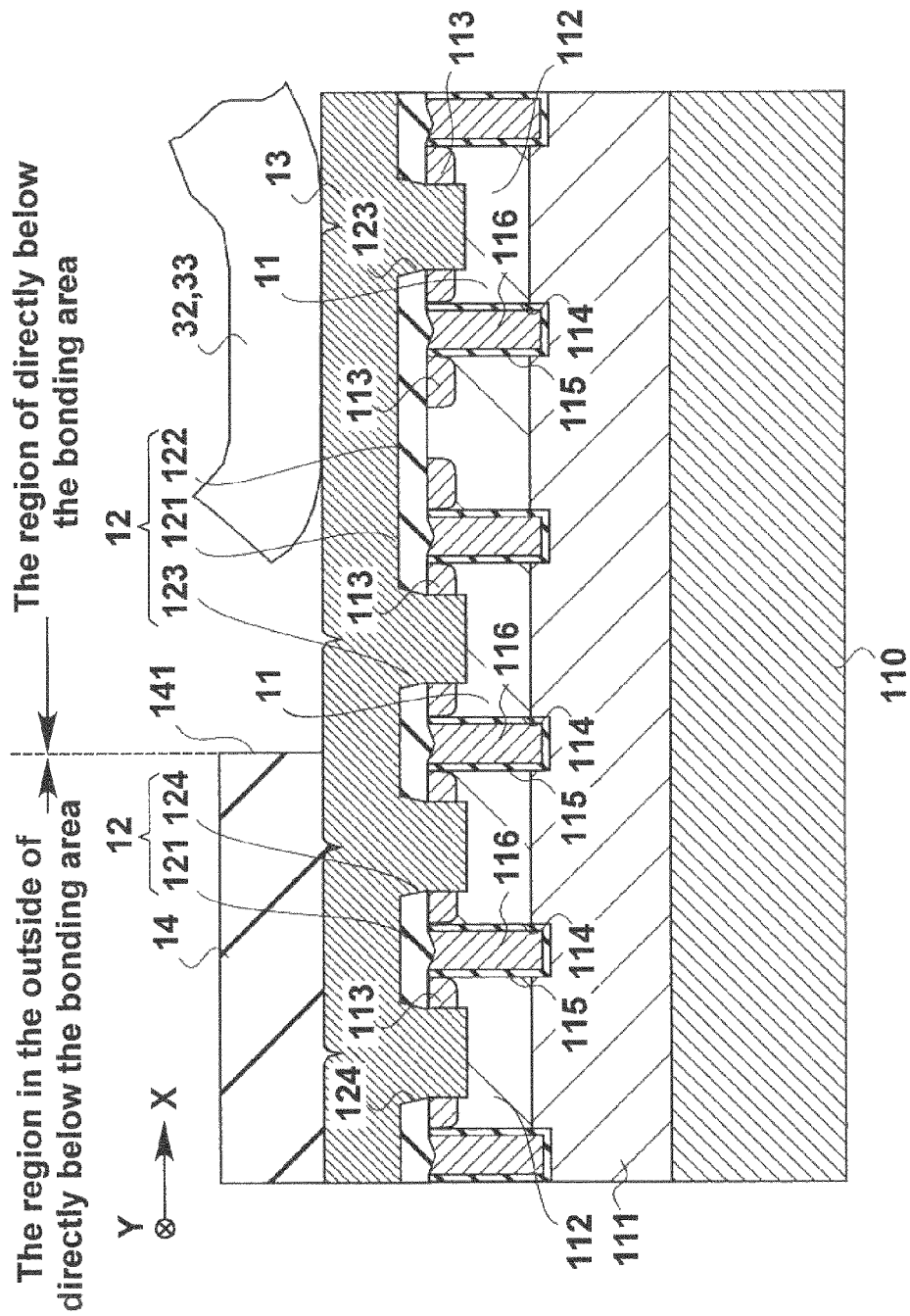
FIG. 11 is an expanded cross sectional diagram of the important parts when arranging a bonding wire on the semiconductor elements shown in FIG. 9.

The semiconductor element 1 is an IGBT 11 and this IGBT 11 is formed from an IGBT having a trench gate structure in the fourth embodiment as is shown in FIG. 11 and FIG. 2. That is, the IGBT 11 is arranged with a p type fourth semiconductor region 110 which is a collector region (or drain region) (below called a collector region 110), a first semiconductor region 111 (below called base region 111) which is an n type base region and an n type first semiconductor region, a p type second semiconductor 112 which is a p type base region (called base region 112 below), an n type third semiconductor region 113 which is an emitter region (below called emitter region 113), a hole (trench) 114, a gate insulation film 115, a gate electrode 116, a collector electrode (first electrode) which is arranged on the entire bottom surface of the collector region 110, and an emitter electrode (second electrode) 13. Here, gate electrode is used with the same meaning as the gate electrode explained in the first embodiment.

The base region (substrate) 111, as is shown in FIG. 4, is formed with a planar shape having a first edge 101 and a second edge 102 opposing each other in the first direction and a third edge 104 and a fourth edge 104 opposing each other in second direction. The base region 111, in the manufacturing process of the semiconductor element 1, is cut out from a silicon single crystal wafer by a dicing process after manufacturing the IGBT (cell) 11, and is a semiconductor chip. The planar shape of the base region 111 is not always limited to this planar shape. For example, the base region 111 may be formed by a planar rectangle in which the first edge 101 and the second edge 102 are long edges and the third edge 103 and the fourth edge 104 are short edges.

Here, in the fourth embodiment, first direction and second direction are used with the same meaning as the first direction and second direction explained in the first embodiment.

As is shown in FIG. 9 to FIG. 11 and FIG. 2 to FIG. 5 stated previously, the planar shape of the interlayer insulation layer 12 related to the fourth embodiment is a mesh shape which, within the bonding area of the first electrode 13, includes a plurality of extension parts 121 arranged at fixed intervals in the second direction and arranged between the second electrode 12 and gate electrode 116 which extend in the first direction, a connection part 122 which connects an adjacent connection part 121, and an aperture 123. In the planar shape of the interlayer insulation film 12 outside of the bonding area of the first electrode 13, only the extension part 121 which is formed between the second electrode 13 and the gate electrode 116 has a stripe shape.

The mesh shape of the interlayer insulation film 12 means a planar shaped extension part 121 having a stripe shape and arranged on the gate electrode 116 (hole 114), extending in the same direction as the first direction in which the gate electrode 116 extends and arranged at fixed intervals in the second direction the same as the gate electrode 116, a connecting part 122 formed as one part by linking with an adjacent extension part 121 in the second direction, and the aperture 123 formed in a region which is surrounded by two adjacent extension parts 121 in the second direction and two adjacent connecting parts 122 in the first direction. Because the connection part 122 is connects adjacent extension parts 121 in the second direction at fixed intervals in the first direction, it is possible to improve the mechanical strength of the extension part 121 of the interlayer insulation film 12 and the gate electrode 116 directly below it within the bonding area of the second electrode 13. In particular, it is possible to prevent cracks and tears in the extension part 121 and the gate electrode 116 directly below it with respect to stress which is generated when bonding (for example, ultrasound vibration energy). On the other hand, the connecting part 122 of the interlayer insulation film 12 is arranged between adjacent extension parts 121 in the second direction, however, the connecting part 122 is arranged within the bonding area, and because aperture 123 is arranged as much as possible in a mesh shape also within the bonding area, it is possible to reduce contact area and current capacitance between the emitter 131 and the second electrode 13 and also prevent electrical field concentration. In addition, because it is possible to achieve these effects simply by changing the aperture pattern of the interlayer insulation film 12, because a new process is not added to the manufacturing process, the manufacturing becomes easier and manufacturing costs do not increase. In the fourth embodiment, it is possible to practically use a silicon oxide film, specifically, a phosphosilicate glass (PSG) film as the interlayer insulation film 12, and the thickness of this phosphosilicate glass film is set at 0.5 μm to 3.0 μm for example.

Figure 12:
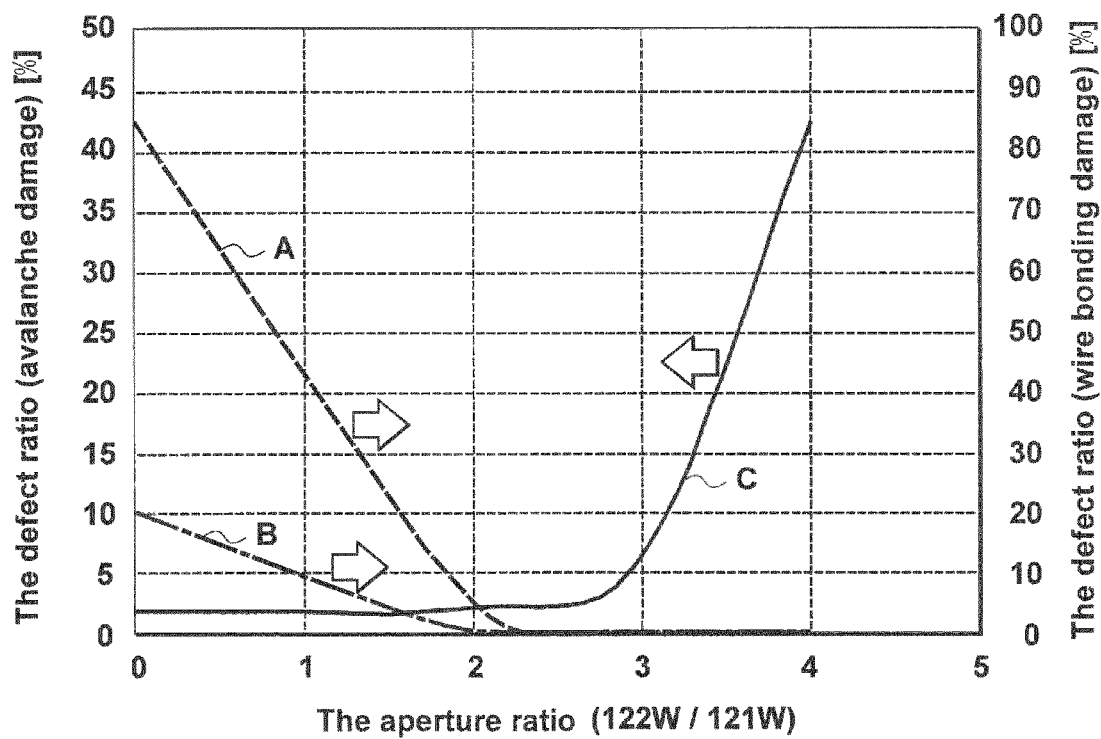
FIG. 12 is a diagram which shows the relationship between the aperture ratio and imperfection ratio of the interlayer insulation layer related to the fourth embodiment.

Here, the causal relationship between the aperture ratio and the defect ratio of the aperture 123 of the interlayer insulation film 12 is shown in FIG. 12. In FIG. 12 the horizontal axis shows the aperture ratio of the aperture 123 of the interlayer insulation film 12, the left vertical axis shows the defect ratio (%) due to avalanche damage and the right vertical axis shows the defect ratio (%) due to wire bonding damage. Here, because etching is performed until the third semiconductor region 113 is passed through using the aperture 123 of the interlayer insulation film 11 as a mask, the aperture ratio is a value which divides the second direction width dimension (=the first width dimension 121: from one end of the gate insulation film 114 of the extension part 121 to the aperture part 123 at the shortest distance) of the extension part 121 of the interlayer insulation film 12 equivalent to the first width dimension 121W of the third semiconductor region 113 shown in FIG. 9 and FIG. 10, by a width dimension (=second width dimension 122W) of the first direction of the connection part 122 equivalent to the second width dimension 122W of the third semiconductor region 113.

The aperture ratio of the aperture 123 of the interlayer insulation film 12 increases, that is, when the second width dimension 122W of the connection part 122 increases with respect to the first width dimension 121W of the extension part 121, it is possible to reduce the defect ratio caused by wire bonding damage. The defect ratio effectively becomes 0 (zero) when the aperture ratio is 2.2 in the curve A and the aperture ratio in the curve B is 2.0 shown in FIG. 12. That is, it is possible to prevent cracks and tears in the extension part 121 of the interlayer insulation film 12 and the gate electrode 116 directly below it. The wire bonding conditions of curve A are the bonding load is 1200 g/cm$^2$, ultrasound vibration energy (ultrasound power) is 145 Hz at a first side, and 190 Hz at a second side, and the ultrasound vibration time is 120 msec at the first side and 170 msec at the second side. In addition, the wire bonding conditions of curve B are the bonding load is 1200 g/cm$^2$, ultrasound vibration energy (ultrasound power) is 145 Hz at a first side, and 180 Hz at a second side, and the ultrasound vibration time is 120 msec at the first side and 170 msec at the second side.

On the other hand, the aperture ratio of the aperture 123 of the interlayer insulation film 122 increases, that is when the second width dimension 122W of the connection part 122 increases with respect to the first width dimension 121W of the extension part 121 increases, the defect ratio caused by avalanche damage increases when the aperture ratio is 2.6 as a border as is shown in the curve C. In the aperture 123, a current path is shortest from a bonding wire on the region in which the third semiconductor region 113 is exposed. However, the current path becomes longer from the center (for example, shown by K in FIG. 10) of the connection part 122 to the third semiconductor 113 and the dynamic time lag of a current becomes larger. With respect to the amount of avalanche tolerance, it is important that the energy which is applied is diffused over a larger area, the current concentration is relaxed and a parasitic transistor is not switched ON. Within this, lowering the resistance of the second semiconductor region 112 directly below the third semiconductor region 113 is effective. Because etching is performed until one part of the third semiconductor region 113 is passed through with the interlayer insulation film as a mask, the aperture 123 and the resistance of the second semiconductor region 112 directly below the third semiconductor region 113 has a close relationship. That is, based on the causal relationship shown in FIG. 12, if the second width dimension 122W of the connection part 122 is set larger (first width dimension 121W<second width dimension 122W) with respect to the first width dimension 121W of the extension part 121 of the interlayer insulation film 12, it is possible to reduce the defect ratio caused by wire bonding damage. Furthermore, while reducing the defect ratio caused by wire bonding damage, in order to reduce the defect ratio caused by avalanche damage, it is necessary to satisfy the relationship between the first width dimension 121W of the extension part 121 of the interlayer insulation film 12 and the second width dimension 122W of the connection part 122 shown below.

Second width dimension<2.0×first width dimension– 2.6×first width dimension

Other dimensions related to the fourth embodiment of the present invention which satisfy the above formula are as follows (refer to FIG. 10)

1. Hole width (a) of the hole 114: 0.5 μm
2. Arrangement pitch (b) of the hole 114: 2.0 μm
3. Width (121W) of the extension part 121 of the interlayer insulation film 12: 0.5 μm
4. Width (122W) of the connection part 122 of the interlayer insulation film 12: 1.0 μm
5. Arrangement pitch (c) in a second direction of the connection part 122: 9.0 μm
6. Length (d) of the hole 114: 8.0 μm
7. Impurity density of the second semiconductor region 112: $6.0 \times 10^{17}$ atoms/cm$^2$
8. Bonding depth of the second semiconductor region 112: 1.4 μm
9. Impurity density of the third semiconductor region 113: $5.0 \times 10^{19}$ atoms/cm$^2$
10. Bonding depth of the third semiconductor region 113: 0.3 μm
11. Width dimension of the gate electrode 116: 0.5 μm In the fourth embodiment, as is shown in FIG. 3, it is preferable that the planar shape of the interlayer insulation film 12 is adopted so that a mesh shape in which the aperture 123 arranged at fixed intervals in the first direction and an aperture 123 adjacent in a second direction are offset. The amount of offset is half an arrangement pitch for example.

Here, bonding area of the second electrode 12 in which the planar shape of the interlayer insulation film is set in a mesh shape means a region in which a bonding wire (32) which electrically connects the second electrode (emitter electrode) 13 and an emitter lead (external terminal) is bonded. A protection film 14 is arranged on the second electrode 13, an aperture 141 for electrically connecting the bonding wire (32) with the second electrode 13 is arranged on the protection film 14 as is shown in FIG. 11, and the bonding area of the second electrode 13 is within a region of the aperture 141 set in the protection film 14.

The planar shape of the interlayer insulation film 12 outside the bonding area of the second electrode 13 is a stripe shape. Specifically, the interlayer insulation film 12 is arranged with a plurality of planar shaped extension part 121 having a stripe shape arranged above gate electrode 116 (or hole 114) extending in the same direction as the first direction in which the gate electrode 115 extends and arranged at fixed intervals in a second direction the same as the arrangement direction of the gate electrode 116, and a plurality of aperture parts 124 having a planar shape sandwiched between adjacent extension parts 121 in the second direction and arranged at firs intervals in the second direction. Outside the bonding area of the second electrode 13, because it is not necessary to increase mechanical strength with respect to the stress generated when bonding it is not necessary to arrange the connection part 122 between adjacent extension parts 121 in the second direction. As a result of not arranging the connection part 122, because it is possible to increase the aperture area of the aperture part 124, it is possible to secure contact area and current capacitance between the emitter region 113 and the second electrode 13 and prevent electric field concentration.

In other words, the second electrode (emitter electrode) 13 is arranged on the interlayer insulation film 12 and within the bonding area of the second electrode 13, the second electrode 13 is connected to the IGBT 11 via the aperture 123 of the interlayer insulation film 12. Outside the bonding area of the second electrode 13, the second electrode is connected to the IGBT 11 via the aperture 124 of the interlayer insulation film 12. The second electrode 13 is used as an emitter electrode (or source electrode) and a aluminum alloy film for example can be used as the second electrode 13. The aluminum alloy film is an aluminum added with additives such as Si for preventing alloy spike, or Cu for preventing migration.

As is shown in FIG. 11, the protection film 14 is arranged on the second electrode 13 in the entire region above the main surface of the substrate 10. In an element region, the aperture 141 is arranged in a bonding area of the second electrode 13. In addition, as is shown in FIG. 4, in the protection film 14, in an element region, the bonding electrode 13G for connecting to the gate electrode 116 of the IGBT 11 is exposed by the aperture 142 of the protection film 14. The bonding electrode 13G of the gate electrode 116 is formed by the same conduction material in the same conduction layer as the second electrode 13. The aperture 141 of the protection film 14 is arranged at the center part of the base region (substrate) 111 as is shown in FIG. 4, and the aperture 142 is arranged near the third edge 103 of the base region 111. The planar area of the aperture 142 is small compared to the planar area of the aperture 141. It is possible to practically use a resin film such as PIF (polyimide-film) or PSG film for example as the protection film 14.

Assembly Structure of the Semiconductor Device

Similar to the semiconductor device 201 shown in FIG. 4, the semiconductor device 201 related to the fourth embodiment is arranged with a semiconductor element 1, a first lead (collector external terminal) 21 which extends in a first direction (X direction) having a die bonding region 21D in which a semiconductor element 1 is mounted, a second lead (gate external terminal) 22 which extends in the first direction and is arranged to left side of the first lead 21, a third lead (emitter external terminal) 23 which extends in the first direction and is arranged to the right side of the first lead, a bonding wire 31 which electrically connects the second lead and the bonding electrode 13G of the semiconductor element 1, a bonding wire 32 which electrically connects the third lead and a bonding area of the second electrode 13 of the semiconductor element 1, and a sealing body 4.

It is possible to use a Cu plate or a Fe—Ni alloy plate as the first lead 21, second lead 22 and third lead 23. Ni plating may also be used on the surface of the Cu plate.

Although not shown in detail in FIG. 11 and FIG. 4, the first electrode of the back surface of the semiconductor element 1 is electrically and mechanically connected to the die bonding region 21D of the first lead 21 via a conduction adhesive.

The bonding wire 31 is electrically connected to the bonding region 13G via the aperture 142 which is formed on the protection film 14 of the semiconductor element 1. Similarly, the bonding wire 32 is electrically connected to the electrode 13 via the aperture 141 which is formed on the protection film above the substrate 10. A wire of Au, Lu, Al can be practically used as the bonding wire 31, 32 and this wire is bonded by combining thermal compression with ultrasound vibrations used a bonding device.

An epoxy resin for example can be used as the sealing body 4. This epoxy resin is formed for example by a molding method. An inner part (one part) of each of the semiconductor 1m the first lead 21, the second lead 22 and the third lead 23 and the bonding wires 31, 32 are air tight sealed within the sealing body 4. An outer part (one part) of each of the first lead 21, the second lead 22 and the third lead 23 projects out from the exterior of the sealing body 4.

The assembly sequence of the semiconductor device 201 is as follows. First, the semiconductor element 1 is manufactured formed with the IGBT 11, interlayer insulation film 12, second electrode 13 and protection film 14 in this order. Next, the semiconductor element 1 is installed on the die bonding region 21D of the first lead 21. Next, the bonding wires 31 and 32 are bonded. Then, the semiconductor device 201 related to the fourth embodiment is completed by molding the semiconductor element 1 by the sealing body 4.

Characteristics of the Semiconductor Device

As is shown in FIG. 9 to FIG. 11 and FIG. 2 to FIG. 4, in the semiconductor device 201 related to the fourth embodiment, the planar structure of the interlayer insulation film 12 within the bonding area is formed in a mesh shape, and because the mechanical strength increases by the connection part 122, the extension part 121 adjacent in a second direction of the interlayer insulation film 12, bonding strength of the interlayer insulation film 12 when bonding is secured, and tears which occur in the interlayer insulation film 12 with bonding and breaks in an electrode (for example, the gate electrode 116 and the second electrode 13) are prevented.

Furthermore, in the semiconductor device 201 related to the fourth embodiment, because the connection part 122 of the interlayer insulation film 12 is arranged at fixed intervals in the second direction, it is possible to sufficiently secure the planar area of the aperture 123. Therefore, because it is possible to sufficiently secure the contact area which is the original characteristic of the IGBT 11, it is possible to reduce an electric filed concentration, secure sufficient resistance and provide a semiconductor device 201 with the semiconductor element 1 which has good electrical characteristics.

Furthermore, in the semiconductor device 201 related to the fourth embodiment, because the ratio between the first width dimension 121W below the extension part 121 (or the extension part 121) of the third semiconductor region 113, and the second width dimension 122W below the connection part (or the connection part 122) of the third semiconductor region 113 is set within an appropriate range, it is possible to secure the bonding strength of the interlayer insulation film 12 when bonding and secure sufficient resistance.

In addition, in the semiconductor device 201 related to the fourth embodiment, because the planar shape of the interlayer insulation film 12 outside the bonding area is formed in a stripe shape, it is possible to secure the electrical characteristics of the semiconductor element 1 as stated previously.

In addition, in the semiconductor device 1 related to the fourth embodiment, because it is possible to change the planar shape of the interlayer insulation film 12 for demonstrating these operation effects simply by changing the pattern of a manufacturing mask, there is no particular need to increase the number of manufacturing processes, and it is possible to reduce manufacturing costs. Furthermore, because it is not necessary to increase the thickness of the second electrode 13 and bonding electrode 13G for bonding, it is also possible to reduce manufacturing costs in this way.

Transformation Example

In the semiconductor device 201 related to a transformation example of the fourth embodiment, the planar shape particularly within the bonding area of the interlayer insulation film 12 of the IGBT 11, similar to the semiconductor device 201 related to the first embodiment shown in FIG. 8, is formed as needed by a mesh shape so that an aperture 123 arranged at fixed intervals in the first direction and an aperture 123 which is adjacent in the second direction are on the same straight line. That is, the connection part 122 is formed in one straight line when seen in the second direction, and when seen in the first direction is formed repeatedly at fixed intervals, and the planar shape of the interlayer insulation film 12 related to the transformation example un-offset the arrangement pitch of the connection part 122 and aperture 123.

In the semiconductor device 201 related to the transformation example formed in this way, it is possible to demonstrate the same effects as the effects obtained from the semiconductor device 201 related to the fourth embodiment.

Furthermore, in the semiconductor device 201 related to the fourth embodiment, the planar shape of the interlayer insulation film 12 only within a bonding area of the semiconductor element 1 is formed in a mesh shape. However, the present invention is not limited to the type of structure and the planar shape of the interlayer insulation film within and outside the bonding area can be a mesh shape.

Mode 5 of the Invention

The fifth embodiment of the present invention is a transformation example of a power semiconductor device and manufacturing method of the semiconductor device related to the fourth embodiment and explains an example in which the present invention is applied to a power semiconductor device and manufacturing method of the semiconductor device mounted with a semiconductor element comprised of an IGBT having a planar structure.

Device Structure of the Semiconductor Element (IGBT)

The semiconductor element 1 mounted on the semiconductor device 201 related to the fifth embodiment, as shown in FIG. 13, is formed by an IGBT 11 having a planar structure. That is, the IGBT 11 is formed by arranging a collector region (p type fourth semiconductor region) 110, an n type base region (n type second semiconductor region or substrate) 111, a p type base region (p type second semiconductor region) 112, an emitter region (n type third semiconductor region) 113, a gate insulation film 115, a gate electrode 116, a collector electrode (first electrode) and an emitter electrode (second electrode) 13. A cross sectional structure of a basic semiconductor element 1 is the same as the cross sectional structure of the semiconductor element 1 of the semiconductor device 201 related to the fourth embodiment stated previously. However, the hole 114 shown in FIG. 9 and FIG. 10 is not arranged. That is, in the semiconductor element 1, the gate electrode 116 is arranged with a planar structure via the gate insulation film 114 on the main surface of the base region 111, and a base region 112 and emitter region 113 are arranged by a double diffusion structure with the gate electrode 116 as a mask.

Mode 6 of the Invention

The sixth embodiment of the present invention explains an example in which the connection method between the semiconductor element 1 with the second lead 22 and the third lead 23 is replaced in the semiconductor device 201 related to the fourth embodiment and the fifth embodiment stated previously.

In the semiconductor device 201 related to the sixth embodiment, as is shown in FIG. 7 and FIG. 14, the bonding electrode 13G and the second lead 22 of the semiconductor element 1 are electrically connected by a clip lead 22C and the second electrode 13 and the third lead 23 are electrically connected by a clip lead 23C. Soldering paste 35 is used in each of the connections between the clip lead 22C and the bonding electrode 13G and the second clip lead 22, and each are electrically and mechanically connected. Similarly, soldering paste 35 is used in each of the connections between the clip lead 23C and the second electrode 13 and the third clip lead 23, and each are electrically and mechanically connected.

It is possible to use an alloy plate such as a Cu plate or an alloy plate such as a Fe—Ni plate for example for the clip lead 22C and the clip lead 23C. It is possible to use Pb—Sn solder or Pb free solder such as Sn-3 wt % Ag-0.5 wt % Cu for the soldering paste 35 and 36. Similar to the bonding of the bonding wire 31, a bonding method where thermal compression is combined with ultrasound vibrations is used in the connection of the clip lead 22 to the bonding electrode 13G via the soldering paste 35, and the connection of the clip lead 22C to the second lead 22 via the soldering paste 35. Similarly a bonding method which combines thermal compression with ultrasound vibrations similar to a heating method using a heater or bonding of the bonding wire 32, is used in the connection of the clip lead 23C to the second electrode 13 via the soldering paste 36, and the connection of the clip lead 23C to the third lead 23 via the soldering paste 36.

In addition, in order to improve bondability of the bonding electrode 13G and the soldering paste 35, and in order to improve the bondability of the second electrode 13 and the soldering paste 36, a wetability improvement film can be formed on the surface of each of the bonding electrode 13G and the second electrode 13. It is possible to practically use a compound layer stacked with an Ni layer on a Ti layer for example as the wettability improvement film.

In the semiconductor device 201 related to sixth embodiment formed in this way, the same effects can be demonstrated as the effects obtained by the semiconductor 201 related to the fourth and fifth embodiments stated previously.

Furthermore, the resistance and inductance component of a metal plate or alloy plate of the clip lead 22C and 23C is small compared to a wire. Reversely, stress generated at the bonding part between a metal plate or alloy plate and a bonding area is large. However, because a connection part 122 is arranged on the interlayer insulation layer 12 in the bonding area of the second electrode 13 in the sixth embodiment, it is possible to increase mechanical strength in the bonding area of the second electrode 13. Therefore, in the semiconductor device 201 the resistance and inductance component can be reduced and it is possible to prevent tears in the interlayer insulation film and tears in the gate electrode 116.

As stated previously, the first to the sixth embodiments of the present invention were described by a number of transformation examples, however the descriptions and diagrams which form one part of this disclosure do not limited the present invention. The present invention can be applied to various alternative forms, embodiments and technologies. For example, in the embodiments stated previously, an example of the semiconductor device 201 mounted with the semiconductor element 1 comprised of the IGBT 11, however, the present invention is not limited to the IGBT 11. It is possible to applied the present invention to a semiconductor element comprised from a power transistor (power MOSFET) and a semiconductor device mounted with this semiconductor element. In addition, the present invention can also be applied to a semiconductor element comprised of a power transistor having not only a trench structure but also a planar structure and a semiconductor device mounted with this semiconductor element. In addition, the corner part of the aperture 123 of the interlayer insulation film 123 may be round.

INDUSTRIAL APPLICABILITY

The present invention can be widely used in a semiconductor device and manufacturing method of the semiconductor device in which it is necessary to prevent damage of interlayer insulation film and damage of an electrode which is generated with bonding while securing bonding strength. In addition, the present invention can be widely used in a semiconductor device and manufacturing method of the semiconductor device in which it is necessary to prevent damage of interlayer insulation film and damage of an electrode which is generated with bonding while comparatively securing damage tolerance and bonding strength. In addition, the present invention can be widely used in a semiconductor device and manufacturing method of the semiconductor device in which it is necessary to improve the electrical characteristics of a semiconductor element. Furthermore, the present invention can be widely used in a semiconductor device and manufacturing method of the semiconductor device in which it is necessary to reduce manufacturing costs.

The invention claimed is:
1. A semiconductor device comprising:
   a substrate having a first edge and a second edge opposing each other in a first direction and a third edge and a fourth edge opposing each other in a second direction which intersects the first direction;
   a plurality of first semiconductor regions arranged in the second direction on the substrate and exposing a first main surface and having a first conductivity:
   a plurality of second semiconductor regions arranged in the second direction within the first semiconductor region and exposing a second main surface on the first main surface of the first semiconductor region and having a second conductivity:
   a control electrode arranged between the second semiconductor region of the first semiconductor region and other second semiconductor regions of other first semiconductor regions which are adjacent in the second direction;
   an interlayer insulation film having an aperture part which exposes the first main surface of the first semiconductor region and the second main surface of the second semiconductor region, the aperture part having an aperture shape defined by a connection part which connects at fixed intervals in the first direction extension parts adjacent in the second direction, the extension part extending in the first direction and covering a top of the control electrode; and
an electrode arranged on the interlayer insulation film and which electrically connects the first main surface of the first semiconductor region and the second main surface of the second semiconductor region via the aperture part of the interlayer insulation film.

2. The semiconductor device according to claim 1, further comprising:
a hole which extends in the first direction and is arranged between the second semiconductor region of the first semiconductor region and other second semiconductor regions of other first semiconductor regions adjacent in the second direction and which penetrates the first semiconductor region to a substrate side from the first main surface of the first semiconductor region: and
an insulation film arranged on a side surface of the hole and a bottom surface of the hole;
wherein the control electrode is buried in the hole via the insulation film.

3. The semiconductor device according to claim 1, further comprising:
a third semiconductor region arranged between the second semiconductor region of the first semiconductor region and other second semiconductor regions of other first semiconductor regions adjacent in the second direction, and exposing a third main surface and having a second conductivity; and
an insulation film arranged on the third main surface of the third semiconductor region;
wherein the control electrode is arranged on the third main surface of the third semiconductor region via the insulation film.

4. The semiconductor device according to claim 1, wherein the interlayer insulation film is formed in a mesh shape by the extension parts, the connection part and the aperture part.

5. The semiconductor device according to claim 1, wherein the connection part of the interlayer insulation film is arranged in a region directly below a bonding area of the electrode.

6. The semiconductor device according to claim 1, wherein external wiring of a wire or a clip lead is electrically connected to the electrode.

7. A method of manufacturing a semiconductor device comprising:
forming a substrate having a first edge and a second edge opposing each other in a first direction and a third edge and a fourth edge opposing each other in a second direction which intersects the first direction, a plurality of first semiconductor regions arranged in the second direction on the substrate and exposing a first main surface and having a first conductivity, a plurality of second semiconductor regions arranged in the second direction within the first semiconductor region and exposing a second main surface on the first main surface of the first semiconductor region and having a second conductivity, a control electrode arranged between the second semiconductor region of the first semiconductor region and other second semiconductor regions of other first semiconductor regions which are adjacent in the second direction;
forming an interlayer insulation film having an aperture part which exposes the first main surface of the first semiconductor region and the second main surface of the second semiconductor region, the aperture part having an aperture shape defined by a connection part which connects at fixed intervals in the first direction extension parts adjacent in the second direction, the extension part extending in the first direction and covering the top of the control electrode;
forming an electrode arranged on the interlayer insulation film and which electrically connects the first main surface of the first semiconductor region and the second main surface of the second semiconductor region via the aperture part of the interlayer insulation film; and
forming external wiring which is electrically connected to the electrode on the electrode.

8. The method of manufacturing a semiconductor device according to claim 7, wherein forming an interlayer insulation film is forming the interlayer insulation film in which the connection part is arranged in a region directly below a bonding area, and forming the external wiring is forming the external wiring which is electrically connected to the electrode in the bonding area.

9. A semiconductor device comprising:
a semiconductor region having a first conductivity; a plurality of second semiconductor regions arranged in a second direction and exposing a first main surface and giving a second conductivity opposite to the first conductivity; a plurality of third semiconductor regions arranged in the second direction within the second semiconductor region, exposing a second main surface within the second semiconductor region and having the first conductivity;
a control electrode arranged between the third semiconductor region of the second semiconductor region and other third semiconductor regions of other second semiconductor regions which are adjacent in the second direction;
an interlayer insulation film having an aperture part which exposes the first main surface of the second semiconductor region and the second main surface of the third semiconductor region, the aperture part having an aperture shape defined by a connection part which connects at fixed intervals in the first direction extension parts adjacent in the second direction, the extension part extending in the first direction which intersects the second direction and covering a top of the control electrode; and
an electrode arranged on the interlayer insulation film and which electrically connects the first main surface of the second semiconductor region and the second main surface of the third semiconductor region via the aperture part of the interlayer insulation film;
wherein a second width dimension in the first direction of the third semiconductor region below the connection part is larger than a first width dimension in the second direction of the third semiconductor region below the extension part.

10. The semiconductor device according to claim 9, wherein the aperture part penetrates the third semiconductor region.

11. The semiconductor device according to claim 9, wherein the first width dimension and the second width dimension satisfies the following relationship formula:
Second width dimension <2.0×first width dimension−2.6× first width dimension.

12. The semiconductor device according to claim 9, further comprising:
a hole which extends in the first direction and is arranged between the third semiconductor region of the second semiconductor region and other third semiconductor regions of other second semiconductor regions adjacent in the second direction and which penetrates the second semiconductor region on a first semiconductor region side from the first main surface of the second semiconductor region: and an insulation film arranged on a side surface of the hole and a bottom surface of the hole;

wherein the control electrode is buried in the hole via the insulation film.

13. The semiconductor device according to claim 9, wherein the connection part of the interlayer insulation film is arranged in a region directly below a bonding area of the electrode.

14. A method of manufacturing a semiconductor device comprising:

forming a semiconductor region having a first conductivity, a plurality of second semiconductor regions arranged in a second direction and exposing a first main surface and giving a second conductivity opposite to the first conductivity, a plurality of third semiconductor regions arranged in the second direction within the second semiconductor region, exposing a second main surface within the second semiconductor region and having the first conductivity, a control electrode arranged between the third semiconductor region of the second semiconductor region and other third semiconductor regions of other second semiconductor regions which are adjacent in the second direction;

forming an interlayer insulation film having an aperture part which exposes the first main surface of the second semiconductor region and the second main surface of the third semiconductor region, the aperture part having an aperture shape defined by a connection part which connects at fixed intervals in the first direction extension parts adjacent in the second direction, the extension part extending in the first direction which intersects the second direction and covering a top of the control electrode;

forming an electrode arranged on the interlayer insulation film and which electrically connects the first main surface of the second semiconductor region and the second main surface of the third semiconductor region via the aperture part of the interlayer insulation film;

forming external wiring which electrically connects the electrode on the electrode in a bonding area.

* * * * *